United States Patent
Matsumoto et al.

(10) Patent No.: US 6,538,722 B2
(45) Date of Patent: Mar. 25, 2003

(54) PROJECTION EXPOSURE METHOD, PROJECTION EXPOSURE APPARATUS, AND METHODS OF MANUFACTURING AND OPTICALLY CLEANING THE EXPOSURE APPARATUS

(75) Inventors: Yukako Matsumoto, Tokyo (JP); Susumu Mori, Tokyo (JP); Taro Ogata, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/143,952

(22) Filed: May 14, 2002

(65) Prior Publication Data

US 2002/0126268 A1 Sep. 12, 2002

Related U.S. Application Data

(62) Division of application No. 09/488,021, filed on Jan. 20, 2000, now Pat. No. 6,411,368, which is a continuation of application No. PCT/JP98/03271, filed on Jul. 22, 1998.

(30) Foreign Application Priority Data

| Jul. 22, 1997 | (JP) | ............................................. 9-195790 |
| Aug. 26, 1997 | (JP) | ............................................. 9-229518 |
| Mar. 18, 1998 | (JP) | ............................................. 10-68265 |

(51) Int. Cl.$^7$ .............................................. G03B 27/42
(52) U.S. Cl. ............................ 355/53; 355/67; 355/68; 355/69; 355/71; 250/492.2; 430/30
(58) Field of Search ............................ 355/53, 67, 68, 355/69, 71; 250/492.2; 430/30

(56) References Cited

U.S. PATENT DOCUMENTS

| 4,624,551 A | 11/1986 | Anzai et al. ................... 355/53 |
| 4,871,237 A | 10/1989 | Anzai et al. ................. 350/419 |
| 5,602,683 A | 2/1997 | Straaijer et al. ............. 359/811 |
| 5,661,546 A | 8/1997 | Taniguchi ..................... 355/53 |
| 5,721,608 A | * 2/1998 | Taniguchi |
| 5,912,727 A | * 6/1999 | Kawai |
| 6,268,904 B1 | 7/2000 | Mori et al. ..................... 355/53 |
| 6,288,769 B1 | 9/2001 | Akawaga et al. .............. 355/30 |

FOREIGN PATENT DOCUMENTS

| EP | 0 874 283 | 10/1998 |
| JP | 1-265513 | 10/1989 |
| JP | 2-177314 | 7/1990 |
| JP | 2-177317 | 7/1990 |
| JP | 10-116766 | 5/1998 |
| JP | 2/177315 | 7/2000 |
| WO | WO 98/57213 | 12/1998 |

* cited by examiner

*Primary Examiner*—Russell Adams
*Assistant Examiner*—Khaled Brown
(74) *Attorney, Agent, or Firm*—Armstrong, Westerman & Hattori, LLP

(57) ABSTRACT

A laser beam emitted from an exposure laser beam source has a uniform illuminance distribution after passing through a fly-eye lens selected according to the aperture stop. The exposure light is projected onto a reticle on which a predetermined pattern is formed, and the reticle pattern is projected onto a wafer by means of a projection optical system having a pupil filter inserted therein. A cleaning light beam branching off from the exposure light beam is projected through a beam splitter and a total reflection mirror onto the fly-eye lens located at a retraction position. A plane-parallel plate at the retraction position is irradiated with a cleaning light beam. The fly-eye lens and the plane-parallel plate are self-cleansed by the cleaning light beam, so that the transmissivity is kept higher than a predetermined value during standby.

25 Claims, 14 Drawing Sheets

PROJECTION EXPOSURE METHOD, PROJECTION EXPOSURE APPARATUS, AND METHODS OF MANUFACTURING AND OPTICALLY CLEANING THE EXPOSURE APPARATUS

This application is a division of prior application Ser. No. 09,488,021 filed Jan. 20, 2000 now U.S. Pat. No. 6,411,368, which is a Continuation of international application PCT/JP98/03271 filed Jul. 22, 1998.

BACKGROUND OF THE INVENTION

The present invention relates to a projection exposure method for exposing a pattern as an original print, such as a mask or reticle (hereinafter referred to collectively as a "mask"), to a photosensitive substrate, such as a wafer, in a photolithography process for manufacturing semiconductor elements, such as LSIs, image pickup elements, CCDs, liquid crystal display elements or thin film magnetic heads, to an projection exposure apparatus for use in the projection exposure method, and to methods for manufacturing and optically cleaning the exposure apparatus.

As a degree of integration of semiconductor elements becomes higher, rapid progress has also been made of projection exposure apparatuses for use in a photolithography process that is important for the manufacture of such semiconductors. The resolving power of a projection optical system to be loaded on a projection exposure apparatus may be represented, as it is well known as Rayleigh's formula, by the relationship as represented by $R=k \times \lambda \times NA$, wherein R is the resolving power of a projection optical system, $\lambda$ is the wavelength of a light for use in exposure, NA is an aperture number of the projection optical system, and k is a constant to be determined by the process, in addition to the resolving power of a photoresist.

In order to realize the resolving power required for the projection optical system in correspondence with a high degree of integration of semiconductor elements, efforts have been continued to shorten the exposure light source or to enlarge the number of apertures of the projection optical system, i.e. to make the NA higher. Recent years, an exposure apparatus using krypton fluoride excimer laser beam (KrF excimer laser beam) with an output wavelength of 248 nm as an exposure light beam source and having the aperture number of 0.6 or larger of the projection optical system can be commercially available so that the exposure to a pattern as fine as 0.25 µm can be effected.

Further, an argon fluoride excimer laser (ArF excimer laser) with an output wavelength of 193 nm has recently been put to practical use after the krypton fluoride excimer laser. If an exposure apparatus could be realized which uses the argon fluoride excimer laser beam as an exposure light beam source, it can be expected that the processing as fine as 0.8 µm to 0.13 µm can be effected. Great efforts have currently been continued to make research to develop such an exposure apparatus that can use the such laser beam.

The material for use as a lens is currently restricted to only two materials, i.e., synthetic quartz glass and calcium fluoride (fluorite) glass, from the point of view of transmittance or the like in the wavelength region of the output wavelength (193 nm) of the argon fluoride excimer laser. Therefore, extensive efforts have been continuously made to develop optical material for use with an exposure apparatus of this kind, which has a sufficient level of transmittance and an inner material uniformity. Synthetic quartz glass having an inner transmittance of 0.995/cm or higher and calcium fluoride having a negligible level of inner absorption have currently been developed.

Material to be coated on the surface of an optical material for use in preventing reflection is very narrow in a selection scope and undergoes great restrictions upon the freedom of design, as compared with material in a wavelength region of the output wavelength (248 nm) of krypton fluoride excimer laser. However, the problems are being overcome by extensive development efforts, and the loss at each lens plane is being realized to a level below 0.005 or less.

In a wavelength region shorter than the wavelength of the KrF excimer laser beam, the problems may be caused to arise such that the transmittance or reflectance of an optical system is caused to be reduced (fluctuate) due to the phenomenon that if water or organic material would be attached to the surfaces of optical elements constituting the optical system (illumination optical system or projection optical system) in a projection exposure apparatus. In other words, the problems with a variation or fluctuation in an attenuation factor of the optical system may be caused to arise due to a variation or fluctuation in the transmittance or reflectance. The such problems may result from the attachment of impurities to the surface of the optical system, such impurities including water, hydrocarbons or organic substances for example, derived from gases present in a space interposed between plural optical elements, the inner wall of a lens barrel supporting the optical system, or adhesive.

FIG. 14 shows features of a periodical variation in transmittance of an optical system. The periodical variation is represented by measuring an illuminance of an exposure light beam on a portion between a laser beam source and a mask and an illuminance of the exposed light on a wafer at predetermined time intervals while emitting pulse laser beams continuously from the laser beam source and calculating a ratio of the illuminance of the exposure light beam to the illuminance of the exposed light beam at every measured time as a variation in transmittance of the optical system. As it is apparent from FIG. 14, the transmittance is caused to be reduced to a great extent immediately after the start of irradiation with a laser beam and thereafter the transmittance arises gradually to reach an almost saturated state as some time elapses. The reduction in transmittance immediately after the start of the irradiation with laser beam is caused by a fluctuation in the inner features of a glass material, and the transmittance is gradually recovered thereafter due to the fact that water or organic substances attached to the surface of the optical system is or are removed by the irradiation with laser beam.

Therefore, the transmittance of the illumination optical system or the projection optical system is caused to arise gradually during the exposure operation of the projection exposure apparatus, that is, upon the transfer of an image of a device pattern formed on a mask onto a photosensitive substrate in a step-and-repeat manner or a step-and-scan manner by illuminating the mask with an exposure light beam from the illumination optical system and projecting at least a part of the image of the device pattern formed on the mask onto the photosensitive substrate by means of the projection optical system. It can be noted herein that the rise of the transmittance represents the effect of temporarily cleaning an projection exposure apparatus, and the optical system with the surface of the optical element activated by the irradiation with an exposure light beam may become rather likely to attract water or organic material present in the surrounding once the irradiation with the light beam would be suspended. With the such phenomenon kept in mind, in the case where the irradiation with the exposure light beam (the exposure operation) is suspended for a long time or for a long period of time, it is considered that the transmittance is made nearly saturated as needed by effecting the optical cleaning by the irradiation with the exposure laser beam for a predetermined period of time prior to the start of exposure and thereafter the exposure operation has been started. This operation is undesirable, however, because it may cause decreasing throughput. Further, the oscillation of laser beam for a long period of time prior to exposure is likewise undesirable because it may result in a decrease in durability of a laser beam source, in addition to a reduction in throughput. Moreover, it is difficult to continue the irradiation with the exposure laser beam all the time, including the time for exchanging wafers and masks.

Then, a description will be made of the problems that may result from the fluctuation in the transmittance of the projection exposure apparatus adapted so as to be used by shifting an optical element as a part of the illumination optical system or the projection optical system.

As the NA of the projection optical system becomes higher, the depth of focus (DOF) as a margin upon the manufacture of a pattern is caused to be reduced, the DOS being as represented by the formula as follows:

$$DOF = K2 \times \lambda / NA^2$$

where K2 is the resolving power of a photoresist; and
λ is a constant to be determined by the process.

There is known the method for improving the resolving power or the depth of focus by changing illumination conditions (i.e., the shape or size of a secondary light source) for illuminating a mask, such as a modified illumination, including a zonal illumination, a special inclined illumination or the like, or a small σ value.

This method can be used for exchanging a state of distributing the exposure light beam on a pupil plane of the projection optical system and it also uses a pupil filter for changing the state in which the light deviates on the pupil plane of the projection optical system in a similar technique. The method by which the resolving power or the depth of focus is improved can be chosen in accordance with the shape or line width of a pattern of a device to be exposed.

In the cases where a system for changing the illumination conditions is adopted, a plurality of aperture stops in various shapes for use with a zonal illumination, a modified illumination, or a small σ value are formed on a circular plate called a turret plate, and either one of the aperture stops is inserted into a light path of the illumination optical system by rotating the turret plate. An optical part such as a fly-eye lens or an input lens for example can be exchanged in accordance with the selected aperture stop. Further, in the cases where an isolated pattern such as a contact hole for example is transferred on a photosensitive substrate, the pupil filter is inserted into the light path of the projection optical system. Therefore, a variety of patterns can be transferred by means of only one projection exposure apparatus onto a photosensitive substrate under optical exposure conditions such as illuminating conditions, NA or the like suitable for each pattern by using an optical system optimized for a device pattern, for example, by changing the illuminating conditions and inserting the pupil filter into a light path in accordance with kinds (e.g., shape, line width, pitch, and so on) of the device patterns to be transferred onto the photosensitive substrate.

Further, in a device on which a line-and-space pattern and an isolate pattern are combined together, reviews have been made to conduct the exposure by using a mask for use with the line-and-space pattern and a mask for use with the isolate pattern in a state in which the mask for use with the line-and-space pattern and the mask for use with the isolate pattern are superimposed on a photosensitive substrate under optimal conditions, because the conditions for optimized illumination or for the NA vary with each pattern. In this case, the features of a resist material on the substrate vary as the interval of the time between the exposure of the line-and-space pattern and the exposure of the isolate pattern becomes longer, so that the masks are exchanged or the conditions of exposure are changed in a sheet unit of a substrate or in a lot unit of substrates.

In the optical system in which a part of the optical elements is exchanged in order to change the conditions of exposure in accordance with the such device pattern, the transmittance of the optical system to be disposed in the light path therefrom can be maintained at a high level by the cleaning effect. A contamination of a part of the optical elements (optical system) which is staying standby at the retraction position, however, advances as the time elapses, due to the attachment of foreign materials such as water or organic material to the optical elements. In particular, as the conditions for exposure are changed, the optical system evacuated from the light path is activated at its surface, so that foreign materials become likely to be attached to the surface thereof. This may cause a rapid reduction in the transmittance. In the cases where the optical system staying in the standby position is used by re-insertion into the light path, the illuminance (intensity) of the exposure light beam on the photosensitive substrate is reduced as the transmittance of the optical system is reduced. This causes the exposure time at every shot to become longer so that the time for processing a sheet of the photosensitive substrate becomes longer to a considerable extent and the throughput is caused to be reduced.

Generally, the projection exposure apparatus can branch off a portion of a light flux leaving from the fly-eye lens (a secondary light source) in the illumination optical system and lead the branched light flux to a light quantity sensor (integrator sensor). The output from the light quantity sensor controls the light quantity of the laser beam exposed on the photosensitive substrate at every shot. If the transmittance of the optical system (including the projection optical system) behind a beam splitter thereof would vary to a great extent, an integrated light quantity of the exposed light reaching to the photosensitive substrate cannot be controlled accurately even if the output from the light quantity sensor would be used. For instance, if a pupil filter staying standby outside the projection optical system would be inserted into the light path, the exposure dose cannot be controlled in an accurate manner. It can thus be considered that the optical cleaning be effected by the irradiation with the exposure light beam prior to the exposure. The optical cleaning before the exposure, however, may cause the problem that may result in the reduction in the throughput for example, in the manner as have been described above. In particular, in the cases where a so-called duplicate exposure is to be effected which can form a one pattern by transferring a plurality of patterns each onto a photosensitive substrate in different exposure conditions, the exposure conditions have to be changed frequently for every pattern. Therefore, if the optical cleaning would be effected whenever the exposure condition is changed, it may cause the problem that the throughput is reduced to an extreme extent.

SUMMARY OF THE INVENTION

Therefore, the primary object of the present invention is to provide a projection exposure method, a projection exposure apparatus for use with the projection exposure method, and a method for manufacturing the projection exposure apparatus, so adapted as to hold a transmittance of an optical element staying in a retraction position at a predetermined value in order to avoid a reduction of illuminance on a photosensitive substrate upon shifting the optical element to an operation position.

The second object of the present invention is to provide a projection exposure method and an apparatus for use with the projection exposure apparatus, which can prevent a fluctuation in the transmittance of the optical system due to the exchange (shift) of a part of the illumination optical system or the projection optical system.

The third object of the present invention is to provide a projection exposure method and an apparatus for use with the projection exposure method, which can always control an integrated light quantity of the exposure light beam (exposure dose) on a photosensitive substrate, without causing a reduction in throughput even if a part of the illumination optical system or the projection optical system would be exchanged.

The fourth object of the present invention is to provide a projection exposure method and an apparatus for use with the projection exposure method, which can always maintain a higher transmittance of the illumination optical system or the projection optical system in which a part of the optical element is exchanged as the exposing conditions for exposing a photosensitive substrate are changed.

The fifth object of the present invention is to provide a projection exposure method, a projection exposure apparatus, a method of manufacturing the projection exposure apparatus, and a method of optically cleaning a projection optical system, so adapted as to control a fluctuation in transmittance or reflectance (a fluctuation in an attenuation factor of an optical system) by utilizing the self-cleansing effect of the optical system.

The exposure method according to the present invention can achieve the above objects by irradiating an optical element staying in a retraction position with a cleaning light beam in the exposure method for use with the exposure apparatus for irradiating a mask with the exposure light beam through an optical system which has a part of optical elements shifted between the operation position and the retraction position.

In the exposure method according to the present invention, the exposure light beam for illuminating the mask may be used for the cleaning light beam. As the cleaning light beam, there may further be used a light beam emitting from a cleaning light beam source disposed separately from a light beam source of the exposure light beam for illuminating the mask. The exposure method may involve the irradiation of an optical element shifted at the retraction position with the cleaning light beam during the transfer of an image of the pattern onto the substrate, or the irradiation of an optical element at the retraction position with the cleaning light beam when the substrate is not irradiated with the exposure light beam during the step of transferring the image of the pattern onto the substrate.

An alternative exposure method according to the present invention can achieve the above-mentioned objects of the exposure method for use with a projection exposure apparatus having an illumination optical system for illuminating an original print with a predetermined pattern formed thereon with the exposure light beam left from the exposure light beam source and a projection optical system for projecting the pattern on the original print illuminated by the illumination optical system onto a photosensitive substrate, wherein an optical element shifted at the retraction position is irradiated with the cleaning light beam during the predetermined pattern formed on the original print is being projected onto the photosensitive substrate.

Another alternative exposure method according to the present invention can achieve the above-mentioned objects of the exposure method for use with a projection exposure apparatus having an illumination optical system for illuminating an original print with a predetermined pattern formed thereon with the exposure light beam left from the exposure light beam source and a projection optical system for projecting the pattern of the original print illuminated by means of the illumination optical system onto the photosensitive substrate, wherein the exposure light beam emitted from the exposure light beam source is controlled so as to irradiate an optical element shifted to the retraction position and not to irradiate the photosensitive substrate when the photosensitive substrate is not irradiated with the exposure light beam in the step of the exposure process for projecting the pattern onto the photosensitive substrate, and the exposure light beam emitted from the exposure light beam source is controlled so as not to irradiate an optical element shifted to the retraction when the photosensitive substrate is irradiated with the exposure light beam in the step of the exposure process for projecting the pattern onto the photosensitive substrate.

The exposure apparatus according to the present invention can achieve the above-mentioned objects in an exposure apparatus which is arranged such that a mask is irradiated with an exposure light beam through an optical system with a part of optical elements thereof arranged so as to be shifted between an operation position and an retraction position and an image of a pattern formed on the mask is transferred onto a substrate, wherein an cleaning optical system for irradiating an optical element shifted to its retraction position with a cleaning light beam is provided.

In the exposure apparatus according to the present invention, the exposure light beam for illuminating the mask may be used for the cleaning light beam. As the cleaning light beam, there may further be used a light beam emitting from a cleaning light beam source disposed separately from a light beam source of the exposure light beam for illuminating the mask. The cleaning optical system may be provided with a branched optical element for leading the exposure light beam as the cleaning light beam, which enters from the light beam source for the exposure light beam into the mask, or with a branched optical element for leading the exposure light beam as the cleaning light beam, which enters into projection optical system for projecting an image of a pattern formed on the mask onto the substrate.

An alternative exposure apparatus according to the present invention can achieve the objects in a projection exposure apparatus having an illumination optical system for illuminating an original print with a predetermined pattern formed thereon with an exposure light beam left from an exposure light beam source and a projection optical system for projecting the pattern of the original print illuminated by means of the illumination optical system onto a photosensitive substrate, in which an optical element constituting a part of the optical system is arranged so as to be shifted between its operation position and its retraction position, which comprises a cleaning optical system for irradiating an optical element shifted to its retraction position with a cleaning light beam during the projection of the predetermined pattern onto the photosensitive substrate.

In the exposure apparatus according to the present invention, the cleaning optical system is provided with a branched optical element for leading an illumination light beam as the cleaning light beam, which is emitted from the exposure light beam source. The branched optical element is arranged so as to control the exposure light beam in such a way that the exposure light beam is led to the cleaning optical system when the exposure light beam is not irradiated onto the photosensitive substrate in the exposure for projecting the pattern onto the photosensitive substrate, and that the exposure light beam is not led to the cleaning optical system when the photosensitive substrate is irradiated with the exposure light beam. Further, this exposure apparatus may be provided with an alternative light beam source for generating the cleaning light beam, which is disposed separately from the exposure light beam source and emits light beam leading to the cleaning optical system.

The manufacturing method for manufacturing the exposure apparatus according to the present invention is directed to a manufacturing method for manufacturing an apparatus for transferring a pattern formed on a mask onto a substrate, which can achieve the above-mentioned objects by the step of locating an optical system with a part of optical elements arranged so as to be shifted between an operation position and a retraction position in an illumination optical system for illuminating the mask and/or a projection optical system for projecting an image of the pattern on the illuminated mask onto the substrate; and the step of optically cleaning the optical element located in the retraction position by irradiating the optical element with the cleaning light beam.

The exposure method according to the present invention can achieve the above-mentioned objects in an exposure method for projecting an image of a pattern formed on a mask onto a substrate, wherein an exposure light beam is entered into an optical system located between a light beam source emitting the exposure light beam and the substrate by setting an aperture number of the optical system to be larger during optical system is not irradiated with the exposure light beam than an aperture number of the optical system during the exposure and permitting the exposure light beam.

In the exposure method according to the present invention, it is preferred that a light blocking member for blocking the entry of the exposure light beam into the substrate is inserted into a light path located between the optical system and the substrate at the time when no exposure is effected and that the light blocking member is retracted from the light path during the exposure is effected. The light blocking member may comprise a light shielding plate that can be inserted into and retracted from the light path of the exposure light beam, the light shielding plate being interposed, for example, between the optical system and the substrate and disposed in such a way that a side thereof facing the optical system constitutes a reflecting surface. In this case, the reflecting surface of the light shielding plate is preferably set so as to make the angle of a normal of the reflecting plane variable in a predetermined angle range with respect to the optical axis of the optical system. Moreover, it is preferred that the light shielding plate is disposed so as to permit the exposure light beam to enter into the optical system while rocking the light shielding plate. In addition, it is preferred that a second aperture stop is disposed in the optical system, which has an aperture dimension larger at the time of no exposure than that of a first aperture stop for use during the exposure.

An alternative exposure method according to the present invention can achieve the above-mentioned objects in an exposure method for projecting an exposure light beam onto a substrate through a mask, wherein the cleaning light beam is distributed on a pupil plane of an optical system in a wider area than the exposure light beam in order to reduce a variation or fluctuation in the transmittance of the optical system through which the exposure light beam passes.

In this exposure method, it is preferred that the transfer of a pattern formed on the mask onto the substrate is carried out separately from the optical cleaning. Further, it is preferred that an aperture number of the optical system to be determined in accordance with the pattern formed on the mask is set to be larger at the time of the optical cleaning than the aperture number of the optical system at the time of transcribing the pattern onto the substrate. Moreover, it is preferred that the exposure light beam is used as the cleaning light beam and that the entry of the exposure light beam into the substrate is blocked at the time of the optical cleaning of the optical system.

Furthermore, an alternative exposure method according to the present invention can achieve the above-mentioned objects in an exposure method for projecting an image of a pattern formed on a mask onto a substrate through an optical system, wherein a light blocking member for blocking the entry of the exposure light beam into the substrate is inserted into a light path located between the optical system and the substrate during the substrate is not irradiated with the exposure light beam and the light blocking member is retracted from the light path during the substrate is irradiated with the exposure light beam.

In this alternative exposure method, it is preferred that the light blocking member comprises a light shielding plate that is so arranged as to be inserted into the light path for the exposure light beam or retracted therefrom, the light path located between the optical system and the substrate, and that has a plane thereof facing the optical system side arranged so as to act as a reflecting plane. In this case, the reflecting plane of the light shielding plate is set such that the angle of a normal thereof is made variable in a predetermined angle range with respect to the optical axis of the optical system. It is further preferred that the exposure light beam is arranged to enter into the optical system while rocking the light shielding plate.

Moreover, an alternative exposure method according to the present invention can achieve the above-mentioned objects in a projection exposure method for use with a projection exposure apparatus having an illumination optical system for illuminating an exposure light beam emitted from an exposure light beam source onto an original print with a predetermined pattern formed thereon and a projection optical system for projecting the pattern of the original print illuminated by means of the illumination optical system onto a photosensitive substrate, wherein the exposure light beam is emitted from the exposure light beam source so as to enter into the photosensitive substrate when the predetermined pattern formed on the original print is projected onto the photosensitive substrate, and so as to block the entry of the exposure light beam into the photosensitive substrate while allowing the entry of the exposure light beam up to the projection optical system when no pattern of the original print is projected onto the photosensitive substrate.

In the projection exposure method as described above, it is preferred that a light blocking member for blocking the entry of the exposure light beam into the photosensitive substrate is disposed in a position between the projection optical system and the photosensitive substrate. It is further preferred that the light blocking member is controlled so as to allow the entry of the exposure light beam into the photosensitive substrate when the pattern of the original print is projected onto the photosensitive substrate, and so as to block the entry of the exposure light beam into the photosensitive substrate while permitting the entry of the exposure light beam up to the projection optical system when the pattern of the original print is not projected onto the photosensitive substrate.

In addition, an alternative exposure method according to the present invention can achieve the above-mentioned objects in a projection exposure method for use with a projection exposure apparatus comprising an illumination optical system for illuminating an exposure light beam left from an exposure light beam source onto an original print with a predetermined pattern formed thereon, a projection optical system for projecting the pattern of the original print illuminated by means of the illumination optical system onto a photosensitive substrate, and a variable aperture stop disposed inside the projection optical system, wherein the exposure light beam is emitted from the exposure light beam source by opening the variable aperture stop at a predetermined aperture number when the pattern of the original print is projected onto the photosensitive substrate, and the exposure light beam is emitted from the exposure light beam source by fully closing the variable aperture stop when the pattern of the original print is not projected onto the photosensitive substrate.

The exposure apparatus according to the present invention can achieve the above-mentioned objects in a projection exposure apparatus having an illumination optical system for illuminating a mask and a projection optical system for projecting an image of a pattern formed on the mask onto a substrate, wherein a blocking device for blocking the entry of an exposure light beam onto the substrate is provided in a light path located between the projection optical system and the substrate.

In the exposure apparatus according to the present invention, it is preferred that the projection optical system is provided with a variable stop and an aperture number of the variable stop is set so as to become larger at the time when no exposure is effected than at the time when the exposure is being effected. It is further preferred that the blocking device comprises a light shielding plate that can be entered into and retracted from a light path located between the projection optical system and the substrate. Moreover, it is preferred that a side of the light shielding plate faced to the projection optical system can act as a light reflecting surface and further that the angle of a normal of the light reflecting plane thereof is made variable in a predetermined angle range with respect to the optical axis of the optical system. In this case, it is furthermore preferred that a drive unit is installed which can swing the light shielding plate and change the angle of the normal of the light reflecting plane in a predetermined angle range with respect to the optical axis of the optical system. In addition, it is preferred that the variable aperture stop is provided in the illumination optical system and the aperture stop is controlled so as to become larger when the exposure light beam is blocked by means of the light blocking device than when the exposure light beam is exposed.

Further, an alternative exposure apparatus according to the present invention can achieve the above-mentioned objects in a projection exposure apparatus having an illumination optical system for illuminating a mask and a projection optical system for projecting an image of an pattern formed on the mask onto a substrate, wherein a light blocking device for blocking the entry of an exposure light beam into the substrate is disposed in the inside of the projection optical system.

This projection exposure apparatus is preferably provided with a variable aperture stop in the projection optical system, and the variable aperture stop can be preferably arranged so as to act as the light blocking device by fully closing the variable aperture stop. Moreover, it is preferred that a variable apperture stop is disposed in the illumination optical system and the variable aperture stop is controlled so as to become larger when the exposed light beam is blocked by means if the light blocking device than when the exposed is being effected.

Another alternative exposed apparatus according to the present invention is directed to an exposed apparatus for transferring a pattern formed on a mask onto a substrate, and this alternative exposure apparatus can achieve the object by installing an optical system for projecting an image of the pattern of the mask onto the substrate and a reflecting device having a reflecting surface which reflects an exposure light beam left from the optical system and having a normal of the reflecting surface set so as to be variable in a predetermined angle range with respect to the optical axis of the optical system.

The manufacturing method for manufacturing an exposure apparatus according to the present invention is directed to a manufacturing method for manufacturing an apparatus for transferring a pattern formed on a mask onto a substrate, and this manufacturing method according to the present invention can achieve the above-mentioned objects by the step of locating a light blocking member for blocking the entryof an exposure light beam ina alight path located between a projection optical system for projecting the pattern of the mask onto the substrate and the substrate, and the step of optically cleaning the projection optical system by the aid of the entry of the exposure light beam thereinto in such a state that the entry of the exposure light beam into the substrate is blocked by means of the light blocking member.

In this manufacturing method, the light blocking member is controlled so as to block the entry of the exposure light beam into the substrate while permitting the entry of the exposure light beam up to the projection optical system when the pattern is not projected onto the substrate, and so as to allow the entry of the exposure light beam into the substrate when the pattern is projected onto the substrate. It is further preferred that the light blocking member is arranged so as for a side thereof facing the projection optical system to work as a light reflecting surface and that the angle between a normal of the light reflecting surface thereof and the optical axis of projection optical system is variable in a predetermined angle range. Moreover, it is preferred that a drive unit is installed for swinging the light blocking member so as to make the angle between the normal of the light reflecting surface thereof and the optical axis of projection optical system variable in the predetermined angle range.

The optically cleaning method for optically cleaning the exposure apparatus according to the present invention is directed to an optically cleaning method for optically cleaning an exposure apparatus for projecting an image of a pattern formed on a mask onto a substrate through an optical system, and the optically cleaning method according to the present invention can achieve the above-mentioned objects such that the exposure light beam is entered into the optical system by setting an aperture number of an aperture stop for the optical system to be larger when no exposure is conducted than when the exposure is in process.

In this optically cleaning method, the optical system is preferably applicable to an illumination optical system for illuminating the mask with a light beam and/or a projection optical system for projecting an image of a pattern formed on the mask illuminated by means of the illumination optical system onto the substrate. It is preferred that a light blocking member for blocking the entry of the exposure light beam into the substrate is inserted into a light path located between the optical system and the substrate during the optical cleaning. The light blocking member preferably comprises a light shielding plate that can be inserted into and retracted from the light path for the exposure light beam located between the optical system and the substrate, and the light shielding plate is preferably disposed such that a side thereof facing the optical system works as a light reflecting surface. It is further preferred that the angle of a normal of the light reflecting plane thereof is variable in a predetermined angle range with respect to the optical axis of the optical system.

An alternative optically cleaning method according to the present invention can achieve the above-mentioned objects in an optically cleaning method for optically cleaning an exposure apparatus for projecting an image of a pattern formed on a mask onto a substrate through an optical system with an aperture stop installed therein, wherein a cleaning light beam is entered into the projection optical system while fully closing the aperture stop.

Further, another alternative optically cleaning method according to the present invention can achieve the above-mentioned objects in an optically cleaning method for optically cleaning an exposure apparatus for transferring an image of a pattern formed on a mask onto a substrate through a projection optical system, wherein a reflecting member having a light reflecting surface for reflecting an exposure light beam toward the projection optical system side is inserted into a light path interposed between the projection optical system and the substrate and the inside of projection optical system is illuminated with the exposure light beam while varying the angle of the normal line of the light reflecting plane in a predetermined angle range with respect to the optical axis of projection optical system.

BRIEF DESCRIPTION OF THE DRAWINGS

FIG. 12 is a perspective view showing an example of a light reflecting device composed of a light reflecting mirror and the like.

FIG. 13 is a perspective view showing another example of a light reflecting device composed of a light reflecting mirror and the like.

DETAILED DESCRIPTION OF THE INVENTION

Figure 1:
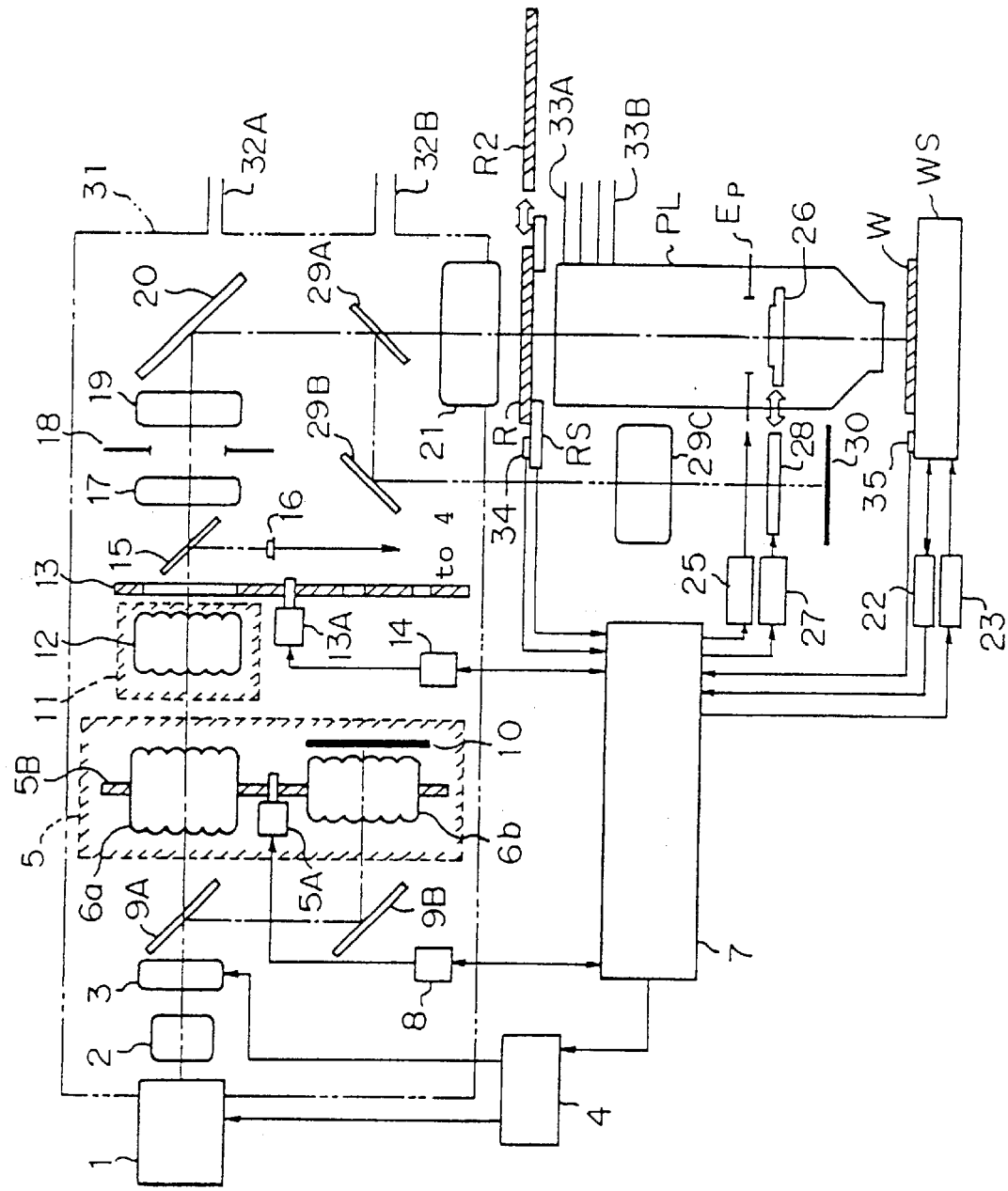
FIG. 1 is a schematic illustration showing an outline configuration of an embodiment of a projection exposure apparatus according to the present invention.

A description will be made of the embodiments of the present invention with reference to the accompanying drawings. FIG. 1 shows an outline configuration of a projection exposure apparatus according to the present invention. As shown in FIG. 1, a laser beam emitted as a nearly parallel light flux from an ArF excimer laser beam source 1 for oscillating a pulse light beam with an output wavelength of 193 nm for example enters into a variable light extinction unit 3 through a beam matching unit 2 consisting of a beam shaping optical system for shaping the laser beam into a laser beam having a. predetermined sectional form, a beam expander and the like. The variable light extinction unit 3 can adjust the light extinction ratio of a pulse laser beam in a stepwise or non-stepwise manner in accordance with an instruction from an exposure light quantity control unit 4 for controlling the exposure light quantity of an exposure light beam. The light beam left from the variable light extinction unit 3 enters into a beam splitter 9A, and the light beam passed through the beam splitter 9A is entered directly into a first illumination optical unit 5 while the light beam reflected thereby is reflected by means of a total reflection mirror 9B and then enters into the first illumination optical unit 5. The illumination optical system is installed in a chamber 31, while a laser beam source 1 is disposed outside the chamber 31 which in turn is provided with a light transmitting window (not shown) that permits laser beam from the laser beam source 1 to pass therethrough.

FIG. 1 shows a system with two of optical integrator lenses in a light path, and the first illumination optical unit 5 is provided with a first fly-eye lens system consisting of two fly-eye lenses 6a and 6b. The fly-eye lenses 6a and 6b are located on a circular plate 5B disposed to be rotated by means of a motor 5A. Either of the fly-eye lenses that is suitable for an aperture stop (the selected first fly-eye lens will hereinafter be indicated as reference numeral "6"), as will be described in more detail, is inserted into a light path for the transmitted light beam transmitted through the beam splitter 9A (the light path being called "an exposure light path" and the position of an optical element shifted to this light path will hereinafter be indicated as "an operation position") in response to the instruction from a first fly-eye lens control unit 8. A stopper 10 composed of a light absorption member is disposed on the light leaving side of the fly-eye lens 6b inserted into the light path for the light beam reflected at the beam splitter 9A and the total reflection mirror 9B (the light path referred to herein being hereinafter called "a standby light path", and the position of the optical element shifted to this light path being called "a retraction position"). This configuration prevents the light beam passed through the first fly-eye lens 6b from being undesirably reflected to become a stray light. These first fly-eye lenses 6a and 6b comprises each a bundle of a large number of lens elements, and a large number of images of light beam sources (secondary light beam sources) corresponding to the number of the lens elements constituting the first fly-eye lenses 6a and 6b are formed on the light-leaving plane side of the lens elements.

The first fly-eye lens 6b inserted into the standby light path is irradiated with an illumination light beam even during the exposure, so that the lens is so-called self-cleansed and the transmittance of the lens is held at a predetermined value or higher even during standby. Therefore, as the first fly-eye lens 6b is inserted into the exposure light path, the transmittance of the first fly-eye lens 6b is substantially equal to the transmittance of the first fly-eye lens 6a being so far used, so that the first fly-eye lens 6b can be used immediately for the exposure processing.

In the cases where three or more of fly-eye lenses suitable for aperture stops are required, two or more cleaning optical systems are required, which lead an illumination light beam to two or more of standby fly-eye lenses as a cleaning light beam. In this case, all fly-eye lenses located in the standby light path may be irradiated with the illumination light beam. In the cases, however, where the procedures of the exposure processing has been established, it may be arranged such that only the fly-eye lens located in the standby light path and staying standby for the next order of use is irradiated with the cleaning light beam. In this case, the light quantity of the light beam to be led to the standby light path is as small as that can provide a predetermined cleaning effect in a given period of time, and the beam splitter 9A can be arranged so as to make the transmittance of the fly-eye lens higher and the reflectance thereof lower, thereby preventing a reduction in the light quantity of the exposure light beam.

The light beam left from the first illumination optical unit 5 then enters into a second fly-eye lens 12 constituting a second illumination optical unit 11. On the light-leaving plane side of the second fly-eye lens 12 are formed a large number of images of light beam sources (secondary light beam sources) corresponding to a large number of lens elements constituting the second fly-eye lens likewise in the case of the first fly-eye lens. An aperture stop is inserted in the vicinity of the light-leaving plane side of the second fly-eye lens, which is selected in a manner as will be described hereinafter.

In this embodiment, the first and second fly-eye lenses 6 and 12 are provided. It can be noted, however, that only the first fly-eye lens 6 can be provided in a manner as will be described hereinafter. Moreover, a rodshaped optical member of the type reflecting at the inner surface can also be used as an optical integrator, in place of the fly-eye lens.

A turret plate 13 is provided with a plurality of aperture stops which differ from each other in at least either of shape or size and disposed at the position at which a large number of the secondary light beam sources are formed by means of the second fly-eye lens 12. The turret plate 13 is rotated by means of a motor 13A to select one of the plural aperture stops in accordance with the kind of the pattern of a reticle R and to insert the selected aperture stop into the light path of the illumination optical system. The motor 13A is controlled through an aperture stop control unit 14 on the basis of an instruction from a main control unit 7. The turret plate 13 and the motor 13A constitute a variable aperture stop device for use with the illumination optical system.

Figure 2:
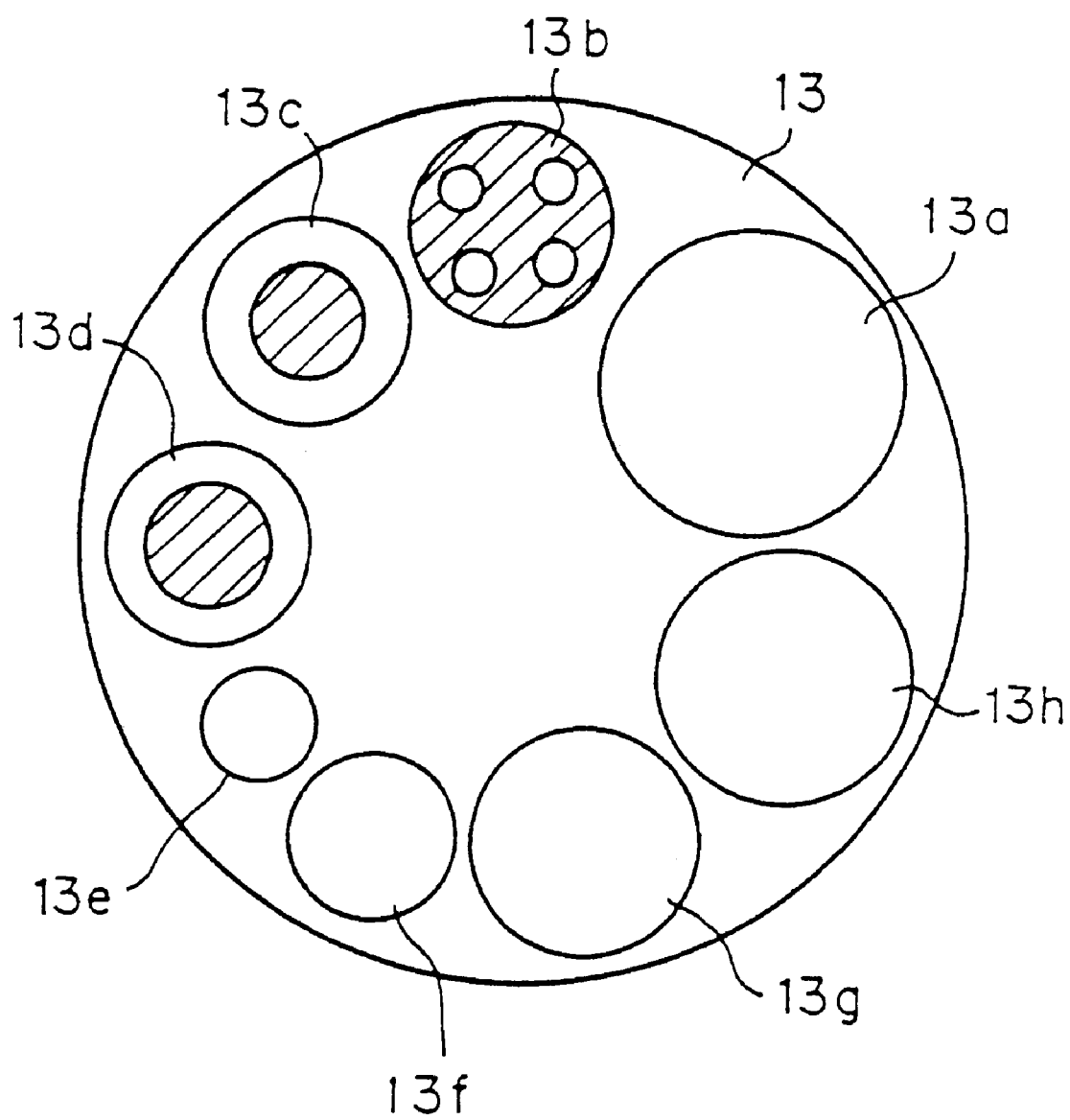
FIG. 2 is a view showing variable aperture stops formed on a turret plate as shown in FIG. 1.

As shown in FIG. 2, the turret plate 13 is provided with, for example, eight aperture stops 13a to 13h, inclusive. The turret plate 13 may be composed of a transparent substrate made of quartz for example. Out of the eight aperture stops, five aperture stops 13a and 13e to 13h having each a circular opening are arranged so as to positively vary a σ value, and three aperture stops 13e, 13f and 13g out of the five are each for use at the time of the actual exposure operation while the remaining two aperture stops 13a and 13h are each for use at the time of the optically cleaning operation.

It should be noted herein, however, that the two aperture stops 13a and 13h are not specifically required to be provided in the turret plate 13, and it is sufficient that only the rest of the aperture stops, i.e., the six aperture stops 13b to 13g, inclusive, is provided therein. It is further to be noted herein that, when the operation of the projection exposure apparatus is suspended for a long period of time, there is the occasion that the optically cleaning operation is carried out by the irradiation with the exposure light beam at the time of re-starting the projection exposure apparatus. In such cases, it is preferred that the aperture stop 13a or 13h is inserted into the illumination optical system and the optically cleaning operation is then carried out. This operation can permit the irradiation of each optical element of the illumination optical system and the projection optical system over the entire surface thereof with the exposure light beam and enhance the cleaning effects of the optical element.

On the other hand, the three aperture stops 13b to 13d, inclusive, each having a modified aperture, are each for use at the time of the exposure operation in order to improve the resolving power and the focal depth of a projection optical system PL. The aperture stops 13c and 13d are stops each having a zonal aperture with a different zonal ratio (i.e., a different ratio of the inner diameter to the outer diameter), while the remaining aperture stop 13b is for use with the object to form plural images of light beam sources (secondary light beam sources) in each of four eccentric regions.

The turret 13 having the eight aperture stops 13a to 13h is rotated by means of the motor 13A, as shown in FIG. 1, and the one that has a desired aperture shape is selected out of the eight aperture stops and set at the position of the secondary light beam source.

Further, the optimal first fly-eye lens 6 is selected from the first fly-eye lenses 6a and 6b so as to comply with the aperture stop selected in accordance with the exposure conditions. At this end, the light beam left from the first fly-eye lens 6 is so arranged as to illuminate only a given lens element of the second fly-eye lens 12 to which the aperture stop is substantially applied and not to irradiate the element thereof that is shielded by the aperture stop. This configuration can effectively use all the exposure light beam and causes no loss of any light quantity of the exposure light beam.

It is further noted that eight of the first fly-eye lenses are not ready so as to comply with each of the eight aperture stops 13a to 13h provided on the turret plate 13 and that no respective first fly-eye lenses are specially required to be ready which correspond to the aperture stops 13a and 13h for example. Moreover, it is noted that six of the first fly-eye lenses are not likewise required to be ready for the remaining six aperture stops 13b to 13g, inclusive, and a one first fly-eye lens is enough to be prepared which is common with at least two of the aperture stops. In these cases, too, the loss of the light quantity of the exposure light beam can be prevented to a sufficient extent.

The light flux from a number of the secondary light beam sources formed by means of the second fly-eye lens 12 is branched off into two light paths by means of a beam splitter 15 after the passage through the variable aperture stop, and the light beam reflected is led to an integrator sensor (a photoelectrical converter) 16 and the illuminance of the illumination light beam is detected. The signal corresponding to the illuminance detected is then inputted into the exposure light quantity control unit 4. The beam splitter 15 is set such that its transmittance is high while its reflectance is low. On the other hand, the light beam transmitted through the beam splitter 15 is condensed by a third illumination optical unit 17 and illuminates an illumination vision field stop unit (a reticle blind system) 18 in a superimposed manner. The illumination vision field stop unit 18 is disposed in a position at which the light-entering plane of the first fly-eye lens 6 of the first illumination optical unit 5 is conjugated with the light-entering plane of the second fly-eye lens 12 of the second illumination optical unit 11. The illumination region on the illumination vision field stop unit 18 may be of a shape generally resembling the shape in section of each lens element of the second fly-eye lens 12. The size of the vision field stop of the illumination vision field stop unit 18 is adjusted by means of a drive mechanism, although not shown, on the basis of an instruction from the main control unit 7 so as to set its aperture corresponding to a shot region of an object to be exposed. This setting can prevent the illumination light beam from irradiating any region other than the original shot region on a wafer W sought to be exposed.

The illumination light beam passed through the illumination vision field stop unit 18 passes through a fourth illumination optical unit 19 and then is reflected at a reflection mirror 20, and the light beam reflected is condensed by means of a fifth illumination optical unit 21 constituting a condenser optical system composed of refractive optical elements including plural lenses and the like. The light beam condensed can illuminate a circuit pattern formed on the reticle R at a substantially uniform distribution of illuminance. In this configuration, a reticle blind in the illumination vision field stop unit 18 is disposed in the position nearly conjugated with the pattern plane of the reticle R in respect of the fourth and fifth illumination optical units 19 and 21, and the illumination region on the reticle R is defined by the blind opening.

With the configuration as described above, an image of the circuit pattern on the reticle R is formed on the wafer W by means of the projection optical system PL, and a photoresist coated on the wafer W is sensed to the exposure light beam to transfer the image of the circuit pattern onto the wafer W.

The reticle R is held on and fixed to a reticle stage RS through a reticle holder. The reticle stage RS is disposed on a base (not shown) so as to move in a two-dimensional way along the plane intersecting at a right angle with the paper plane of FIG. 1. The reticle stage RS is provided with a mirror that reflects the laser beam from a laser interferometer and the reflected laser beam enters into the laser interferometer, thereby enabling the laser interferometer to measure the position of the reticle stage RS. In FIG. 1, the interferometer and the mirror are not shown. The information on the position of the reticle stage RS is then inputted to the main control unit 7 that in turn controls the position of the reticle R by driving a motor for driving the reticle stage. The reticle stage RS is further provided with a reticle illuminance sensor 34, and the illuminance of the illumination laser beam irradiated onto the reticle R is measured. The illuminance measured is then inputted to the main control unit 7. In FIG. 1, reference symbol R2 denotes a reticle to be exchanged. In this embodiment, the reticle R may constitute a reticle for a line-and-space pattern, and the reticle R2 may constitute a reticle for an isolate pattern.

On the other hand, the wafer W is held on and fixed to a wafer stage WS through a wafer holder. The wafer stage WS is disposed so as to move in a two-dimensional way along the plane intersecting at a right angle with the paper plane of FIG. 1. The wafer stage WS is provided with a mirror that reflects the laser beam from a laser interferometer 22 and the reflected laser beam enters into the laser interferometer 22, thereby enabling the laser interferometer 22 to measure the position of the wafer stage WS. The information on the position of the wafer stage WS is then inputted to the main control unit 7 that in turn controls the position of the wafer W by driving a wafer stage drive system 23 for driving the wafer stage. On the wafer stage WS is disposed a wafer illuminance sensor 35 that detects the illuminance of the exposure light beam to be irradiated onto the wafer W. The signal detected by the wafer illuminance sensor 35 is inputted to the main control unit 7. The transmittance of the projection optical system PL is calculated by dividing the output value of the reticle illuminance sensor 34 with the output value of the wafer illuminance sensor 35.

The projection optical system PL in this embodiment comprises optical elements composed of all refractive lenses and so on. The projection optical system PL is provided with a variable aperture stop Ep at the position of a pupil (a light-entering pupil) of the projection optical system PL. The variable aperture stop Ep is composed of a mechanism that can vary the aperture number of the projection optical system, and an aperture stop control unit 25 is composed of a mechanism that can vary the size on the basis of an instruction from the main control unit 7. In this instance, the variable aperture stop Ep disposed in the projection optical system PL is disposed at the position generally optically conjugated with one of the aperture stops 13*a* to 13*h* disposed in the illumination optical system.

A pupil filter 26 is disposed in the vicinity of the variable aperture stop Ep. The pupil filter 26 is used to vary optical characteristics (for example, amplitude transmittance, phase, eccentric state, etc.) between the light flux passing through a first region on the pupil of the projection optical system PL and the light flux passing through a second region on the pupil thereof which is different from the first region. The pupil filter 26 is disposed so as to enter into or be evacuated from the exposure light path of the projection optical system PL by means of a pupil filter control unit 27 on the basis of an instruction from the main control unit 7 in accordance with the shape of a pattern to be exposed or the like. The information on whether the pupil filter 26 is shifted to the operation position in which it is inserted into the light path of the projection optical system PL or to the retraction position in which it is evacuated therefrom is transmitted to the main control unit 7 from the pupil filter control unit 27.

The pupil filter 26 may be composed of, for example, a light shielding member which may shield the exposure light beam in the projection optical system PL in an axially symmetrical form (e.g., round, zonal, etc.), or a light transmitting member which may distribute the exposure light beam in a form so as to assume the depth in its radial direction or in a form in combination therewith. FIG. 1 shows a pupil filter which is composed of a transmitting member having its central portion arranged so as to be thicker than its peripheral portion. When the pupil filter 26 is composed of such a light transmitting member, a plane-parallel plate (its optical thickness being nearly equal to that of the pupil filter 26) is inserted into the exposure light path by means of the pupil filter control unit 27 in order to adjust the focus position, simultaneously when the pupil filter 26 is evacuated from the exposure light path.

In this embodiment of the present invention, the pupil filter 26 or the plane-parallel plate 28 is self-cleansed by the irradiation of the exposure light beam onto the pupil filter 26 or the plane-parallel plate 28, which is retracted from the exposure light path and shifted to the retraction position. At this end, a beam splitter 29A and a total reflection mirror 29B are disposed at the position upstream of the fifth illumination optical unit 21 and forms a cleaning light path optical system that is branched off from the exposure light path. The exposure light beam reflected at the total reflection mirror 29B, as the cleaning light beam, is adjusted for its beam shape in section by means of an optical system 29C for adjusting an irradiation area, and the resulting exposure light beam is then irradiated onto the pupil filter 26 or the plane-parallel plate 28, which is standby at the retraction position, and cleanses the pupil filter or the plane-parallel plate. The cleaning light beam passed through the pupil filter 26 or the plane-parallel plate 28 is absorbed by a stopper 30 made of a light absorption material in order to prevent an occurrence of a stray light.

For the projection exposure apparatus in this embodiment, the illumination optical system is disposed in an inert gas atmosphere which is filled with an inert gas, such as nitrogen gas, etc., so as to control the oxygen content at an extremely low level, in order to prevent the exposure light beam from being absorbed by oxygen. At this end, the projection exposure apparatus is provided with an inert gas supply device for supplying an inert gas to a chamber 31 for the illumination optical system through a pipe 32A and an inert gas discharge device for discharging a contaminated inert gas from the chamber 31 through a pipe 32B. An inert gas such as nitrogen gas, etc. is supplied to a plurality of spaces formed among the plurality of the optical members constituting the projection optical system PL, and a contaminated inert gas is discharged from the plurality of the spaces. The inert gas supply device supplies such a dry inert gas, e.g., nitrogen gas, to the inside of the projection optical system PL through a pipe 33A, and the inert gas discharge device discharges the contaminated fluid present in the projection optical system PL toward outside through a pipe 33B. Such an inert gas may include gases such as helium, argon and so on, although not limiting to nitrogen gas.

When the chamber 31 and a lens barrel of the projection optical system PL are very airtight, it is not required that the replenishment of the inside with nitrogen for example is effected so often once after the air present in the inside has been fully replenished with nitrogen. It is recommendable, however, that nitrogen gas for example is always being flown through the chamber or the lens barrel of the projection optical system, and impurities present in the chamber and the lens barrel of the projection optical system are being removed by means of a chemical filter or an electrostatic filter in order to prevent a fluctuation in the transmittance, because impurities such as water or hydrocarbon molecules derived from various materials such as glass material, coating material, adhesive, paint, metal, ceramics and so on may be attached to the surfaces of the optical elements and the attachment of such impurities may cause a fluctuation in the transmittance.

Now, a description will be made of the operation of the projection exposure apparatus in this embodiment. First, as shown in FIG. 1, a dry inert gas such as nitrogen gas for example is supplied to the chamber 31 and the inside of the lens barrel of the projection optical system PL from the inert gas supply device through the pipes 32A and 33A until the air present therein has been replenished fully with the inert gas, and the fluid present inside the chamber 31 and the lens barrel of the projection optical system PL is then discharged by means of the inert gas discharge device toward outside through the pipes 32B and 33B, respectively.

It is to be noted herein that, although it is preferred that the atmosphere inside the chamber 31 and the spaces formed among the optical elements in the lens barrel of the projection optical system PL is always dried and cleaned by operating the inert gas supply device and the inert gas discharge device all the time even during exposure, as described above, the operation of the inert gas supply device and the inert gas discharge device may be suspended once after the fluid present in the inside of the chamber 31 and the spaces among the optical elements, such as a lens of the lens barrel of the projection optical system PL, has been thoroughly cleaned by replenishment with the inert gas prior to the exposure operation.

Then, the reticle R on which a pattern is drawn as an object of transfer is transported to the reticle stage RS by means of a reticle loading mechanism, although not shown, and then loaded on the reticle stage RS. At this instance, in order to allow the reticle R to be loaded at a predetermined position, the position of the reticle R is measured by a reticle alignment system, although not shown, and is set to the predetermined position by means of a reticle position control circuit, although not shown, on the basis of the result of this measurement.

The wafer W onto which the pattern of the reticle R is to be transferred is in advance coated with a photoresist as a photosensitive material, and the wafer W in this state is transported to the wafer stage WS by means of a wafer loading mechanism, although not shown, and then loaded on the wafer stage WS. The wafer W is then aligned on the wafer stage WS, and held and fixed thereon.

Before starting the exposure operation, the illuminance sensor 35 disposed on the wafer stage WS is transferred on the optical axis of the projection optical system PL to sample a measured value LI of the integrator sensor 16 and a measured value LW of the illuminance sensor 35. On the other hand, a target illuminance TL on the wafer is set in accordance with a sensitivity characteristic of the photoresist material or the like. The integrator sensor 16 outputs signal LI detected in accordance with the illuminance of the exposure light beam uniformed by the first and second fly-eye lenses 6 and 12, respectively. The illuminance sensor 35 outputs signal LW detected in accordance with the illuminance of the exposure light beam on the wafer stage WS. Then, a ratio of the signal LW detected by the illuminance sensor 35 to the signal LI detected by the integrator sensor 16 (an output LW of the sensor 35 output LI of the sensor 16 ratio) is calculated, and the LW/LI ratio is multiplied with a predetermined coefficient K1 to give a gain a. During the exposure operation, the output signal of the integrator sensor 16 is then multiplied with the gain a to output an estimated actual illuminance LPR. In other words, the estimated actual illuminance LPR is to estimate the illuminance on the wafer by multiplying the gain a with the output signal of the integrator sensor 16 during the exposure, the gain a being obtained by multiplying the 50/100 ratio with the coefficient K1, when at the time of the start of the exposure, the measured value of the integrator sensor 16 is set to be 100 and the illuminance on the wafer is set to be 50. The output from the laser beam source 1 is then adjusted so as to make the estimated actual illuminance LPR amount to a target illuminance value TL by permitting the exposure light quantity control unit 4 to vary voltage (charging voltage) to be applied to the laser beam source 1 on the basis of an instruction from the main control unit 7. In this case, the exposure light quantity control unit 4 may be arranged so as to adjust a transmittance (an extinction ratio) of the light extinction device 3 or to control both of the laser beam source 1 and the light extinction device 3. This adjustment can prevent a reduction in illuminance due to deterioration in the laser beam source.

No pattern is present on the wafer W loaded on the wafer stage WS at the first transfer of a pattern, and the wafer W is loaded on the wafer stage WS at a predetermined position, for example, at a position defined by the outer diameter standard of the wafer W, and the pattern is then transferred onto the wafer W. This transfer may be effected in a so-called scan type (a step-and-scan type), which comprises selectively illuminating a part of the pattern on the reticle R through a variable vision field stop (reticle blind) 18, transferring the reticle R by the reticle stage RS relatively to the illumination region defined by the variable vision field stop 18, and transferring the wafer W in synchronism with the reticle R by means of the wafer stage WS relatively to a projection region conjugated with the illumination region with respect to the projection optical system PL by means of the wafer stage WS. The transfer may also be effected in a step-and-repeat type which comprises simultaneously illuminating the entire area of a pattern region on the reticle R and transcribing the pattern.

In the case of the transfer of the pattern on the wafer W at the second time or thereafter, at least the pattern is located on the wafer W. Therefore, the position of the pattern on the wafer W is measured by measuring a mark provided in advance together with the transferred pattern by means of a wafer alignment system, although not shown. The positions of the reticle stage RS and the wafer stage WS are controlled on the basis of the measured position so as to assume a predetermined relationship of the pattern being transferrbed with the pattern transferred previously on the wafer W.

During the period of time during which the pattern is being projected onto the wafer W, the illumination laser beam emitted from the laser beam source 1 is first branched off by the beam splitter 9A and then led to the cleaning optical system where the fly-eye lens 6b staying in the standby position is irradiated by means of the total reflection mirror 9B. This irradiation permits fly-eye lens 6b to be self-cleansed and to hold its transmittance at a predetermined value. The cleaning light beam passed through the fly-eye lens 6b is absorbed by the stopper 10 so that the cleaning light beam is prevented from becoming a stray light.

The first fly-eye lens 6 is also shifted in association with the change of the variable aperture stop 13 in accordance with the exposure conditions in the manner as described above. When the first fly-eye lens 6 is shifted, the actual exposure processing is started if it is determined as a result of comparison of the output value of the integrator sensor 16 with a reference value that the output value of the integrator sensor 16 exceeds the reference value. On the other hand, when it is determined that the output value of the integrator sensor 16 is equal to or less than the reference value, it is required that (1) the output of the laser beam source 1 is made higher; (2) the pulse number is changed (in the case of a projection exposure apparatus of a so-called scan type, the scanning velocity is changed); or (3) the laser beam is exposed in a non-load state in order to optically clean the optical element prior to the actual exposure. In the cases (2) and (3) above, the throughput is caused to be reduced. In this embodiment, however, the first fly-eye lens 6b staying in the standby position holds its transmittance at a predetermined value or higher by optically cleaning, so that transmittance exceeds the reference value when those optical elements are inserted after having been shifted to the operation position of the exposure light path. This operation can permit the exposure processing to be implemented immediately after the exchange of the first fly-eye lens and then prevent a reduction of the throughput.

When the output value of the integrator sensor 16 is equal to or less than the reference value, the wafer stage WS is transferred so as to cause the illumination region of the projection optical system PL (i.e., the region conjugated with the illumination region on the reticle R) to be not located on the wafer W and then the cleaning laser beam is irradiated from the laser beam source 1. This can improve the transmittance of the first fly-eye lens 6 inserted into the exposure light path at the operation position thereof. If the output value of the integrator sensor 16 would exceed the reference value, the oscillation of the laser beam for cleaning is suspended.

Moreover, if the output value of the integrator sensor 16 is equal to or less than the reference value, for instance, the scanning velocity of the wafer W or the reticle R during the scanning exposure may be changed, in place of making the intensity of the exposure light beam on the wafer W higher by making the output (the emission intensity) of the laser beam source 1 or the light extinction device 3 higher. However, in order to control the integrated light quantity on the wafer W so as to amount to an optimal value by changing the scanning velocity thereof when the output value of the integrator sensor 16 is equal to or less than the reference value, it is required that the scanning velocity has to be slowed down yet the number of the exposure light beam (pulse light beam) to be irradiated at each point on the wafer W has to be increased. Therefore, the problem may be caused to occur such that the time required for the scanning exposure by one shot becomes longer and the throughput is caused to be reduced likewise in the case of exposing the laser beam in a non-load state. It is thus found effective that the output (emission intensity) of the laser beam source 1 is adjusted when the output value of the integrator sensor 16 is equal to or less than the reference value.

The process for increasing the number of the exposure light beam to be irradiated at each point on the wafer W during the scanning exposure is not limited to the change of the scanning velocity as described above. In place of hanging the scanning velocity of the wafer W or the reticle during the scanning exposure, the number of the exposure light beams may be increased, for example, by the process involved in making the oscillating frequency of the laser beam source 1 higher or in broadening the width of the exposure light beam in its scanning direction on the wafer W by changing the aperture width of the reticle blind 18. Therefore, when the output value of the integrator sensor 16 is equal to or less than the reference value, the integrated light quantity at each point on the wafer W may be controlled so as to amount to an optimal value (determined in accordance with a sensitivity of the photoresist) by adjusting at least one of the emission intensity of the laser beam source 1, transmittance (light extinction ratio) of the light extinction device 3, the oscillating frequency of the laser beam source 1, and the width of the exposure light beam on the wafer W (i.e., the aperture width of the reticle blind 18) so as to cause no decreasing the scanning velocity. In this instance, it is desired that at least one of the emission intensity of the laser beam source 1, the oscillating frequency of the laser beam source 1, transmittance (light extinction ratio) of the light extinction device 3, and the width of the exposure light beam on the wafer W is adjusted in accordance with the sensitivity of the photoresist so as to sustain the scanning velocity of the wafer at the maximal velocity of the wafer stage WS (as defined by the structure, transferring precision or the like).

It is expected in this case that the time required for the scanning exposure per shot can be shortened most and the throughput can be improved.

The cleaning light beam which is branched off by the beam splitter 29A and then entered into the cleaning optical system then enters into the optical system 29C for adjusting an irradiation surface through the total reflection mirror 29B, and the beam shape in section of the cleaning light beam is then defined, followed by irradiation of the plane-parallel plate 28 or the pupil filter 26 staying in the standby position in the standby light path. This irradiation allows the plane-parallel plate 28 or the pupil filter 26 and other optical elements to be self-cleansed, thereby sustaining the transmittance thereof at a predetermined value. The cleaning light beam passed through the plane-parallel plate 28 or the pupil filter 26 can be absorbed by a stopper 30 so that the cleaning light beam is prevented from becoming a stray light.

When the plane-parallel plate 28 and the pupil filter 26 are shifted, the wafer illuminance sensor 35 on the wafer stage WS is transferred on the optical axis of the projection optical system PL, and the illuminance on the wafer stage WS is measured and the actual exposure is then started when it is found that the illuminance measured exceeds the reference value. In this mode of the embodiment, the transmittance of the pupil filter 26 or the plane-parallel plate 28 staying in the standby position is held at the predetermined value or higher by optically cleaning them, so that there is no risk that the illuminance on the wafer stage WS becomes equal to or less than the reference value when the plane-parallel plate 28 or the pupil filter 26 is shifted. Therefore, In this mode of the embodiment, the exposure processing can be executed immediately after these optical elements are shifted to their operation position of the exposure light path and inserted therein, and the reduction in throughput can be prevented.

If the output value of the wafer illuminance sensor 35 is equal to or less than the reference value, the wafer stage WS Is transferred so as for the illumination region of the projection optical system PL not to be located over the wafer W, and the laser beam for cleaning is irradiated from the laser beam source 1. The irradiation with the cleaning light beam in this state can improve the transmittance of the pupil filter 26 or the plane-parallel plate 28 inserted in the operation position of the exposure light path. On the other hand, when the output value of the wafer illuminance sensor 35 exceeds the reference value, the oscillation of the laser beam for cleaning is suspended.

If the illuminance on the wafer stage WS would be equal to or less than the reference value when the pupil filter 26 or the plane-parallel plate 28 is shifted, it is preferred that the intensity of the exposure light beam is made higher or the pulse number at a predetermined point on the wafer W is increased, so as to cause no decrease in throughput, like wise in the case where the illuminance on the reticle stage RS is equal to or less than the reference value.

The projection exposure apparatus of this type cannot measure the illuminance on the wafer stage WS at a real time during the exposure. In this case, the exposure light quantity (the number of pulses irradiated) is controlled by determining an integrated irradiation quantity of the illumination laser beam detected by the integrator sensor 16 on the upstream side of the reticle (on the laser beam source side) and estimating the exposure light quantity on the surface of the wafer W from the integrated irradiation quantity. In this case, even if the illuminance on the wafer W would be decreased upon a decrease in the transmittance of the optical element downstream of the reticle R (on the wafer side), this information is not fed-back to the output of an exposure light quantity control system, such as the laser beam source 1, so that the exposure light quantity is running short. It is thus essential that the transmittance of the pupil filter 26 and the plane-parallel plate 28 is managed in the manner as described above.

It is apparent from the foregoing that the cleaning of the optical elements staying in the standby position with the cleaning light beam in the above-manner can improve throughput at the time of a duplicate exposure. This will be described more in a specific way. As in the exposure processing which uses two kinds of reticles for example, as in the cases where a line-and-space pattern and an isolate pattern are present in combination, the exposure is conducted under conditions optimal each for the two kinds of the reticles, so that the fly-eye lens 6 to be inserted into the illumination optical system is shifted in accordance with the variable aperture stop 13 or the pupil filter 26 of the projection optical system PL or the plane-parallel plate 28 is shifted. In this case, when stress is placed upon deterioration in characteristics of the photoresist material, it is preferred that the first exposure with a first reticle is effected to a sheet of wafer and the second exposure with a second reticle is effected thereto continuously after the first exposure.

Upon the duplicate exposure, first, various exposure conditions for the first reticle R are set, and the pattern is subjected to projection exposure on a sheet of the wafer W in a step-and-repeat manner or a step-and-scan manner. Thereafter, the oscillation of the laser beam source 1 is suspended and a second reticle R2 is set on the reticle stage RS by means of a reticle loader, although not shown, and aligned while changing various exposure conditions.

After the setting of all the exposure conditions has been finished, the wafer illuminance sensor 35 on the wafer stage WS is transferred on the optical axis of the projection optical system PL and the oscillation of the laser beam source 1 is resumed. When the illuminance on the wafer is found equal to or greater than a predetermined value, the optical element inserted in the light path newly at this time is cleaned to a sufficient extent while staying standby and there is no problem with a decrease in the transmittance, so that the wafer W is then transferred on the optical axis of the projection optical system PL and the actual exposure is effected. On the other hand, if it is found that the illuminance on the wafer W is lower than the reference value, the cleaning upon the optical element in the standby position is not effected to a sufficient extent so that the wafer stage WS is irradiated with the exposure light beam from the laser beam source 1 through the projection optical system PL in a non-load state to irradiate the optical element inserted newly into the exposure light path with the exposure light beam and self-cleanse it. After starting the actual exposure, a ratio of the value detected by the integrator sensor 16 to the value detected by the reticle illuminance sensor 34 is calculated, and the exposure light quantity is controlled on the basis of the ratio calculated. In other words, at least one of four characteristics, i.e., the emission intensity of the laser beam source 1, oscillating frequency of the laser beam source 1, the transmittance of the light extinction device 3, and the aperture width of the reticle blind 18 is adjusted so as to cause no decrease in the scanning velocity of the wafer W, and the exposure light quantity of the wafer W is controlled so as to amount to an optimal value at every shot. On the other hand, if the scanning velocity is not decreased, the scanning exposure may be implemented by adjusting at least one of the above characteristics without effecting the self-cleansing. In this case, however, the transmittance is caused to rise gradually as the exposure operation advances, so that the exposure light quantity may be controlled, for instance, on the basis of the above ratio corrected sequentially by the periodical variation characteristic of the transmittance measured in advance.

Once the laser beam source 1 has been suspended, it takes a long time to resume the steady oscillation. In order to avoid this, it is preferred that a shutter is disposed between the laser beam source 1 and the chamber 31 and the laser beam is blocked by the shutter so as not to allow the passage of the laser beam.

The foregoing description is directed to the cases where the cleaning light path is branched off from the exposure light path and the optical element shifted to the retraction position is always irradiated with the cleaning light beam even during the exposure. When the exposure light quantity is running short on account of the branching of the light beam, it is also possible to lead the exposure light beam to the cleaning light path only at each shot exposure to be effected on the wafer W. In this case, it is possible that each of the beam splitters 9A and 29A comprises a total reflection mirror and that the total reflection mirror is evacuated from the light path during the shot exposure, while the total reflection mirror is inserted into the light path between the shot exposures. Moreover, in the case where the first fly-eye lens 6b staying standby is cleansed simultaneously with the pupil filter 26 or the plane-parallel plate 28, only the beam splitter 29A may comprise the total reflection mirror. In an alternative case, in place of the beam splitters 9A and 29A optical element may be used so as to allow the light beam entered to be transmitted fully during the shot exposure and to be reflected fully between the shot exposures.

Figure 3:
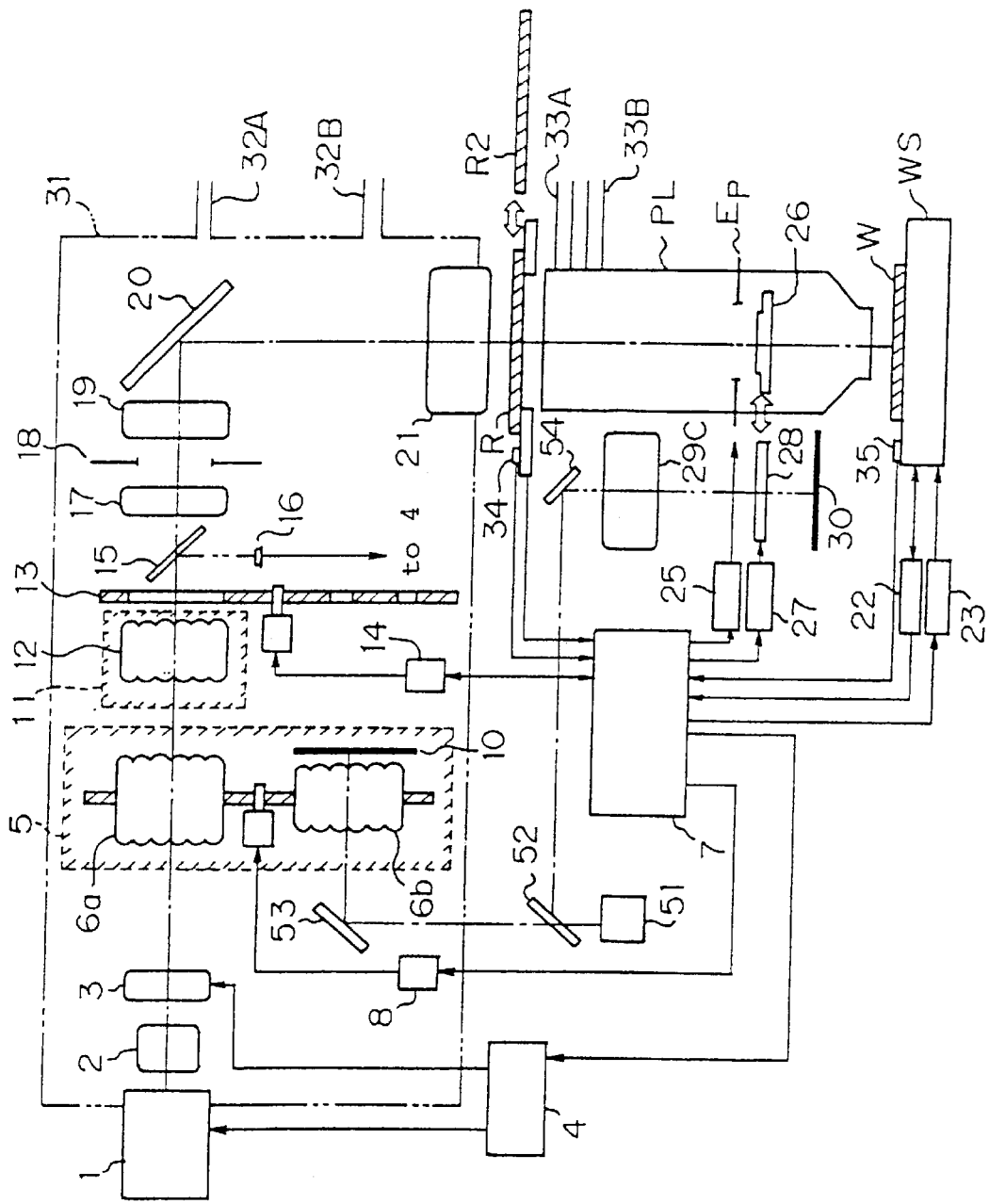
FIG. 3 is a schematic illustration showing an outline configuration of another embodiment of a projection exposure apparatus according to the present invention.

Further, the foregoing description is directed to the case where the laser beam emitted from the exposing laser beam source 1 is branched off into the cleaning light beam which in turn is sent to the cleaning optical system. In the case where the exposure light quantity is running short, however, it is preferred to use a cleaning light beam source. FIG. 3 shows a mode of the embodiment of a projection exposure apparatus for use in this mode of the embodiment according to the present invention. As shown in FIG. 3, a portion of the light beam emitted from a cleaning light beam source 51 passes through a half mirror 52 and is reflected by a total reflection mirror 53 to irradiate the first fly-eye lens 6b. The cleaning light beam reflected by the half mirror 52 is further reflected by a total reflection mirror 54 and passes through the optical system 29C for adjusting an irradiation area of the plane-parallel plate 28 or the pupil filter 26 shifted to its retraction position with the reflected light beam.

It is to be noted herein that the cleaning light beam source 51 may be the same as the exposure light beam source 1. If the optically cleaning effect can be expected, other light sources such as a low pressure mercury lamp and the like may also be used.

Figure 4:
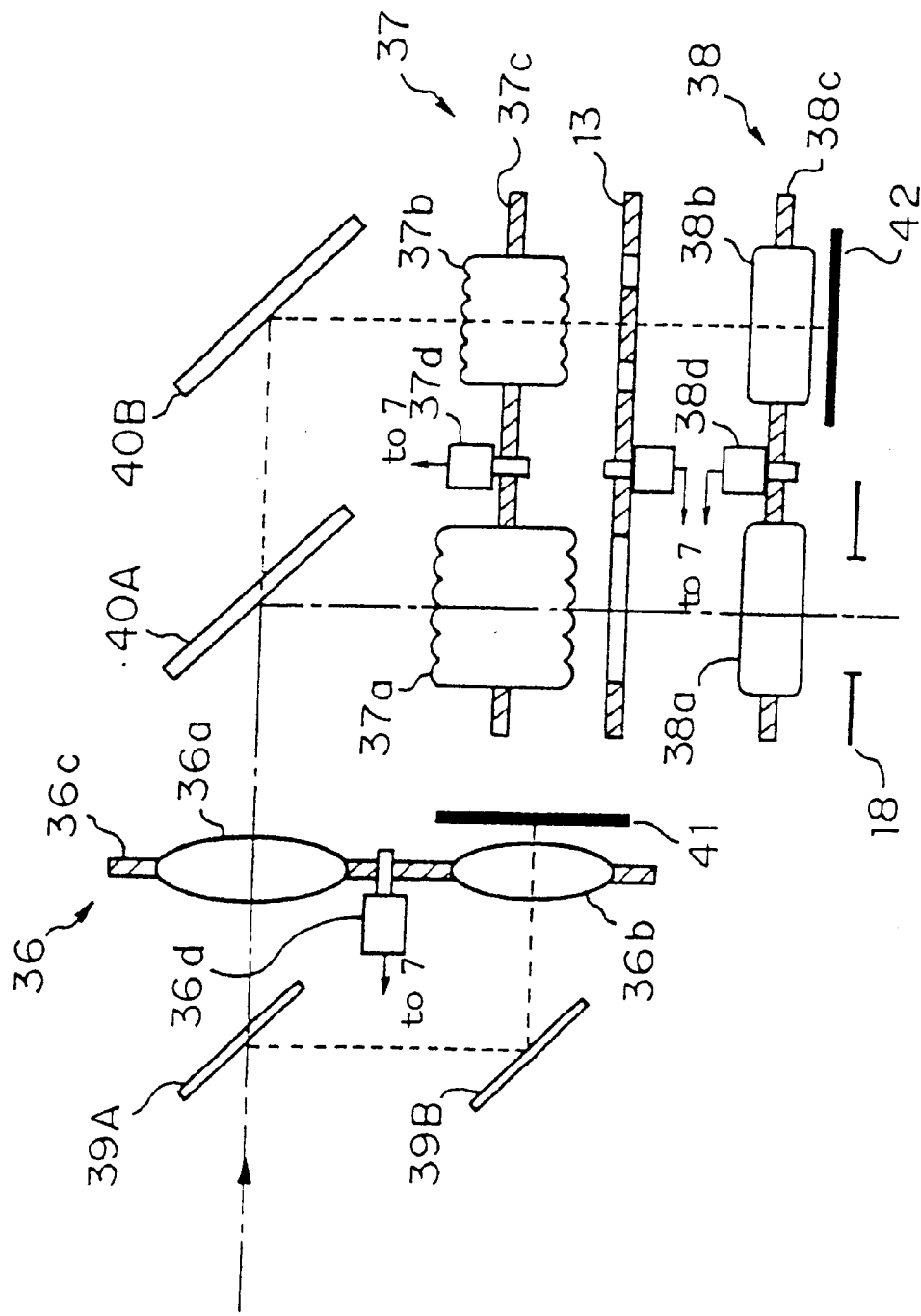
FIG. 4 is a schematic illustration showing an outline configuration of an essential portion according to another embodiment of a projection exposure apparatus according to the present invention.

FIG. 1 indicates the projection exposure apparatus that is provided with the illumination optical system having a so-called double fly-eye lens system. It is also possible that it is provided with an illumination optical system having a so-called single fly-eye lens system. FIG. 4 shows an example of such a projection exposure apparatus. For the projection exposure apparatus in this example, a majority of the exposure light beam from the laser beam source 1 is allowed to pass through a beam splitter 39A while a portion of the exposure light beam is reflected. An input lens unit 36 is provided at the rear stage of the beam splitter 39A input lens unit 36 has input lenses 36a and 36b disposed on a circular plate 36c that in turn is rotated by means of a motor 36d to shift either one of the input lens 36a and the input lens 36b to the operation position in the light path while shifting the other to the retraction position. The input lens 36b shifted to the retraction position is irradiated with the cleaning light beam during the exposure and the transmittance is held at a predetermined value or higher by the aid of the self-cleansing action. At the rear stage of the input lens 36b shifted to the retraction position is provided a stopper 41 that is made of a light absorption material, thereby absorbing the cleaning light beam to prevent the cleaning light beam from becoming a stray light.

A majority of the illumination laser beam passed through the input lens 36a is reflected by means of a beam splitter 40 and a portion of the illumination laser beam is allowed to pass therethrough. At the rear stage of a beam splitter 40A is disposed a fly-eye lens unit 37 that in turn has a large-aperture fly-eye lens 37a for forming a larger secondary light source (planar light source) and a small-aperture fly-eye lens 37b for forming a smaller secondary light source (planar light source) on a circular plate 37c. The circular plate 37c in turn is rotated by means of the motor 37d to shift either one of the fly-eye lens 37a and the fly-eye lens 37b to the operation position in the light path while shifting the other to the retraction position. The fly-eye lens 37b shifted to the retraction position is irradiated with the cleaning light beam during the exposure and the transmittance is held at a predetermined value or higher by the aid of the self-cleansing action.

At the rear stage of the fly-eye lens unit 37, a planar light source as the secondary light source is formed in the vicinity of the light-leaving plane of the fly-eye lens 37a. Further, the turret plate 13 for a variable aperture stop device is disposed in the vicinity of the planar light source in substantially the same manner as described with reference to FIG. 1. Which the fly-eye lens 37a or the input lens 36a corresponding to the fly-eye lens 37a is used is selected in accordance with the aperture stop 13 to be selected. For instance, if an aperture stop for use as a small a stop is selected, the input lens unit can be shifted to a combination of the input lens 36b with the fly-eye lens 37b, which in turn can regulate the size of the aperture to an approximate area of the aperture of the aperture stop. On the other hand, for a zonal illumination or a special inclined illumination, the input lens unit can be shifted to an input lens having a zonal output characteristic.

Upon shifting the fly-eye lens 37, it is required to shift an illumination optical system 38 for illuminating an illumination vision field stop unit, too, and the illumination optical system 38 is disposed at the rear stage of the turret plate 13. The illumination optical system 38 corresponds to the third illumination optical unit 17 as shown in FIG. 1 and comprises lenses 38a and 38b each having a different optical performance disposed on a circular plate 38c that is disposed to be rotated by means of a motor 38d so as to shift either one of the lenses 38a and 38b to the operation position in the light path while shifting the other to the retraction position. The lens 38b shifted to the retraction position is irradiated with the cleaning light beam during the exposure and the transmittance thereof is held at a predetermined value or higher by the aid of the self-cleansing action. At the rear stage of the lens 38b shifted to the retraction position is provided a stopper 42 that is made of a light absorption material, thereby permitting the cleaning light beam to be absorbed thereby and preventing the cleaning light beam from becoming a stray light.

The projection exposure apparatus of FIG. 1 has the light extinction device 3 in the illumination optical system. In the case where the light extinction device 3 is composed of a turret plate, for instance, on which a plurality of ND filters each having a different the transmittance (extinction ratio) are disposed at equally angular intervals, one of the plural ND filters is selected in accordance with the number of pulses of the light beam irradiated at each point on the wafer W and the rest of the ND filters is stayed in the standby position outside the light path. For the light extinction device 3 having the configuration as described above, the transmittance of each ND filter staying in the standby position is caused to be reduced, so that it is preferred that each ND filter staying in the standby position is also irradiated with the exposure light beam in the same manner as in the above examples.

In the case where the optical element as a part of the illumination optical system or the projection optical system is configured so as to be shifted between the operation position and the retraction position in the manner as described above, the optical element located in the retraction position can be irradiated with the cleaning light beam to self-cleanse the optical system. The self-cleansing of the optical system shifted to the retraction position during the exposure serves as holding its transmittance at a predetermined value or higher, so that there is no fluctuation in the transmittance between before and after the shifting of the optical system. Therefore, as the optical element is shifted to the operation position, the exposure processing can be started immediately thereafter without causing any decrease in throughput. Moreover, an integrated light quantity of the exposure light beam (exposure dose) on the photosensitive substrate can be always controlled accurately without causing any decrease in throughput. Further, even if the cleaning of the optical element staying in the standby position would not be effected to a sufficient extent, the transmittance is kept higher to some extent in this case, the time required for the exposure can be shortened greatly even if the irradiation with the exposure light beam in a non-load state would be required to be conducted prior to the exposure. Therefore, this embodiment can contribute greatly to improvements in throughput, as compared in the case where no optical cleaning is effected upon the optical element located at the retraction position.

Moreover, the exposure apparatus in this embodiment of the present invent induces no risk of the exposure light quantity running short, even if a cleaning light source would be provided separately from the exposure light beam source or if the substrate would be optically cleansed when the exposure light beam is not irradiated during the exposure process in progress. In particular, when no cleaning light source is separately disposed in addition to the exposure light beam source, costs for manufacturing the projection exposure apparatus can be reduced to a great extent.

Figure 5:
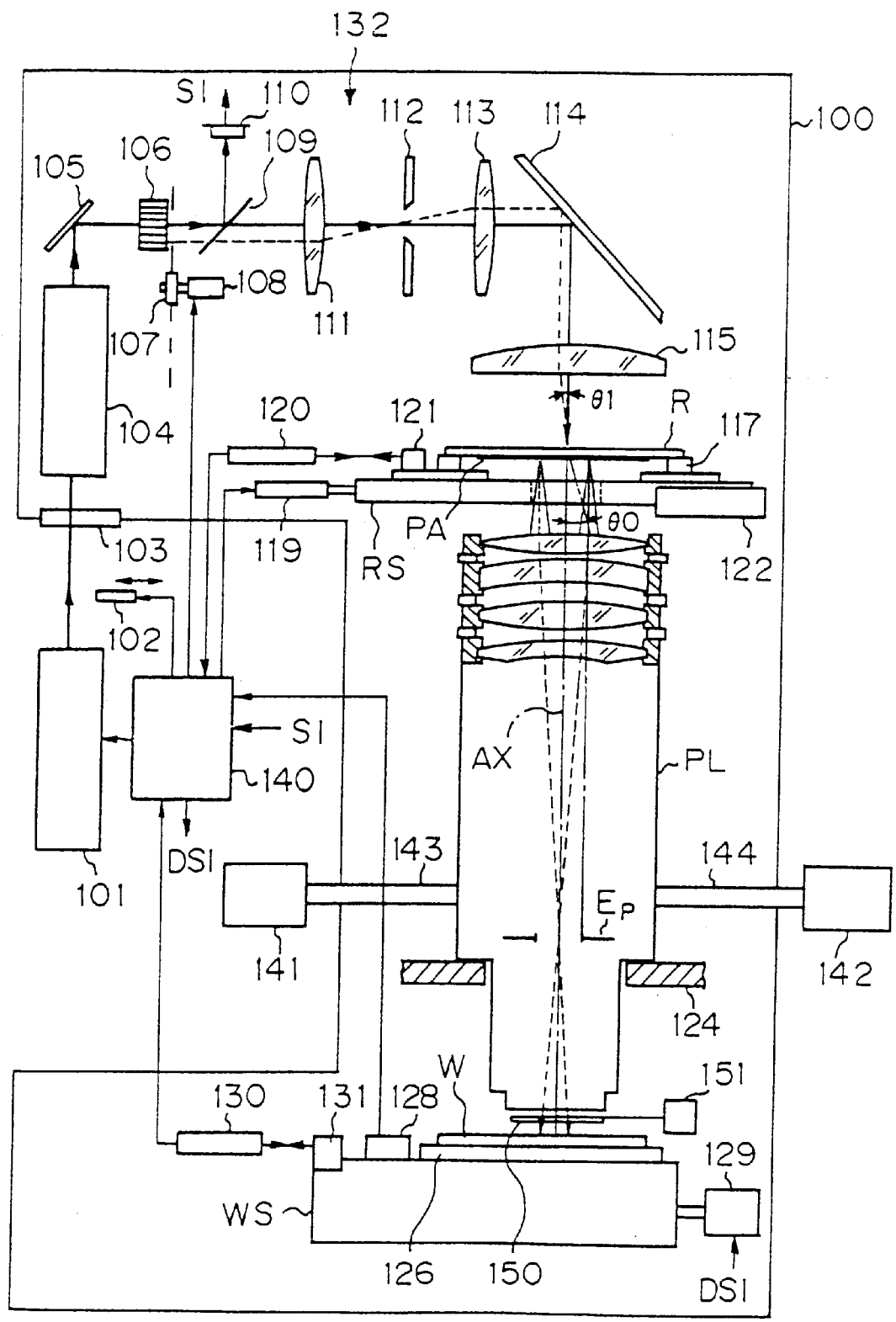
FIG. 5 is a schematic illustration showing an outline configuration of another embodiment of a projection exposure apparatus according to the present invention.
Figure 6:
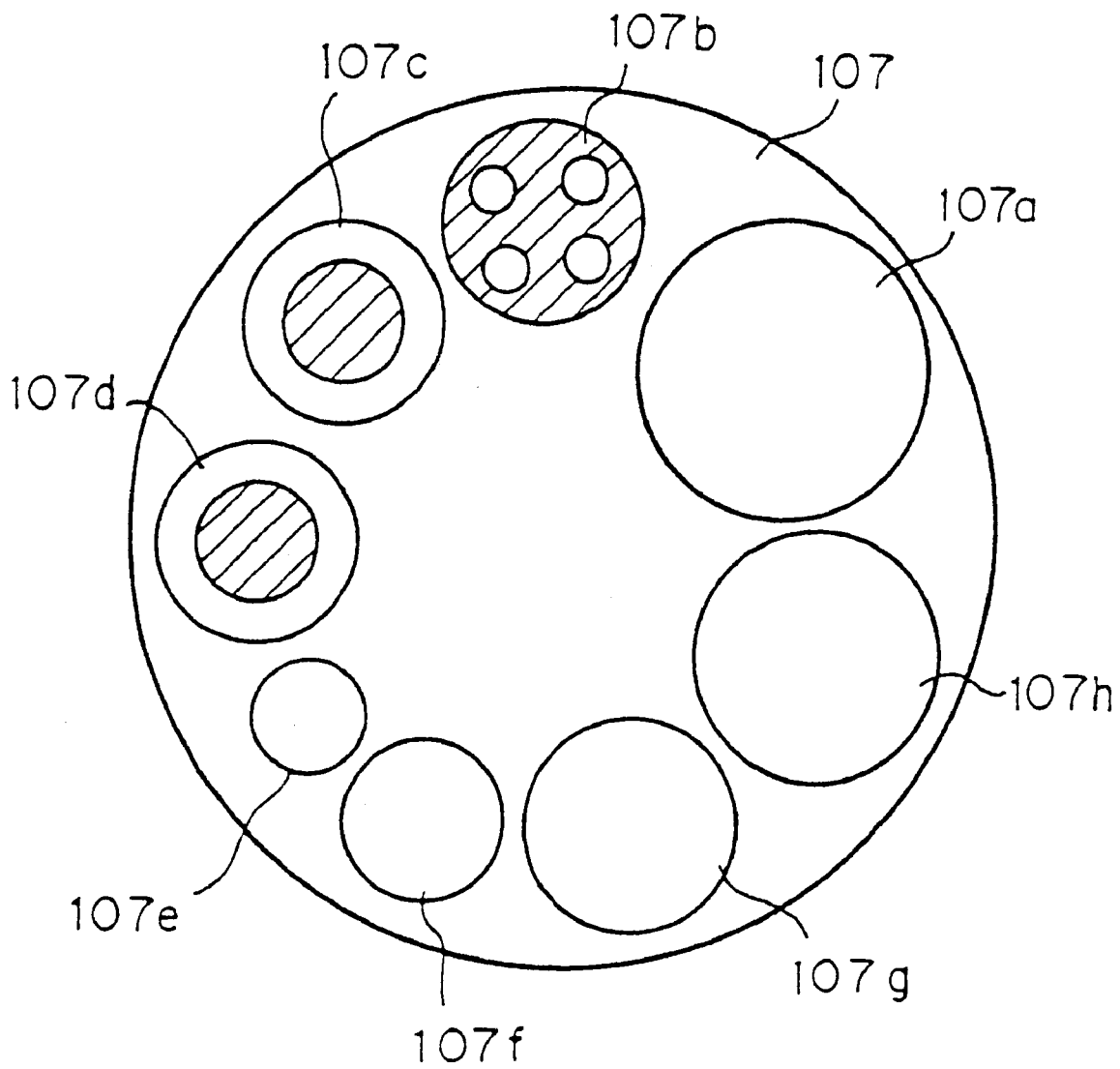
FIG. 6 is a view showing variable aperture stops formed on a turret plate as shown in FIG. 5.

Then, a description will be made of another embodiments of the present invention with reference to FIGS. 5 to 13. FIG. 5 shows an outline construction of the projection exposure apparatus according to another embodiment of the present invention. The apparatus as shown in FIG. 5 is characterized by a light shielding device tor opening and closing a light path located between the projection optical system PL and the wafer stage WS, which in turn is disposed in the light path. Further, the projection exposure apparatus of FIG. 5 has substantially the same overall construction as the projection exposure apparatus of FIG. 1, although the projection exposure apparatus in this embodiment is not constructed such that a part of optical elements of the illumination optical system or the projection optical system is shifted between the operation position and the retraction position as in the case of the projection exposure apparatus as shown in FIG. 1.

In FIG. 5, reference numeral 101 denotes an ArF excimer laser beam source as for the apparatus of FIG. 1. The laser beam source 101 leads laser beams to a light transmitting window 103 on the main body side of the projection exposure apparatus by opening a shutter 102. The main body of the projection exposure apparatus is accommodated in a chamber 100 in which the temperature is controlled at a constant degree. The laser beam passed through the window 103 is subjected to beam shaping and converted into a laser beam having a predetermined shape in section by means of a beam shaping optical system 104, and the laser beam is then reflected by a reflection mirror 105 and then led to a fly-eye lens 106 acting as an optical integrator. The fly-eye lens 106 has the same configuration as the fly-eye lenses 6a and 6b as shown in FIG. 1.

In this embodiment, the projection exposure apparatus is provided with one fly-eye lens 106. Another fly-eye lens may be provided as a second optical integrator between the fly-eye lens 106 and the ArF excimer laser beam source 101 or the reflection mirror 5. Further, in place of the fly-eye lens, there may be used a rod-shaped optical member of an inner reflection type as an optical integrator.

A turret plate 107 may be disposed at the position at which a large number of secondary light sources are to be formed by means of the fly-eye lens 106, the turret plate 107 being configured such that a plurality of aperture stops each having a predetermined shape or a predetermined size are formed in substantially the same manner as in the case of the device as shown in FIG. 1. The turret plate 107 is rotated by driving a motor 108 and inserted into a light path of the illumination optical system after selection of one suitable aperture stop. The turret plate 107 and the motor 108 constitute a variable aperture stop device for use with the illumination optical system.

The light flux from the large number of the secondary light sources formed by means of the fly-eye lens 106 passes through the variable aperture stop and is then branched off by a beam splitter 109 into two light paths. The light beam reflected is led to an integrator sensor 110 and the illuminance of the illumination laser beam is detected. The signal is inputted to a control circuit 140 in accordance with the illuminance detected. On the other hand, the light beam passed through the beam splitter passes through a relay lens 111, a vision field stop 112 and a relay lens 113 and then reflected by a reflection mirror 114. The laser beam reflected is then condensed by a condenser optical system 115 composed of a plurality of refractive optical elements such as lenses and so on, and a circuit pattern PA formed on the reticle R is then illuminated in a superimposed and uniform manner. The projection optical system PL forms an image of the circuit pattern of the reticle R on the wafer W, and the image of the circuit pattern is transferred on the wafer W on which a photoresist is coated in advance.

The projection optical system PL in this embodiment may be composed of all the optical elements such as refractive lenses and so on in substantially the same manner as in the case of the projection optical system PL for the apparatus as shown in FIG. 1, and an aperture stop Ep is disposed at the position of a pupil (a light-entering pupil) of the projection optical system PL. The aperture stop Ep may be composed of a mechanism that can change its size in a manner as in changing the aperture number of the projection optical system PL. In this case, the aperture stop Ep in the projection optical system is disposed at the position optically conjugated with the variable aperture stops 107a to 107 (see FIG. 6) in the illumination optical system.

The reticle R is held by and fixed on the reticle stage RS by means of a reticle holder 117 in substantially the same manner as in the case of the projection exposure apparatus as shown in FIG. 1. The reticle stage RS is disposed on a base 122 so as to move in a two-dimensional way along the plane intersecting at a right angle with the paper plane of FIG. 5. The reticle holder 117 is provided with a mirror 121 that reflects the laser beam from a laser interferometer 120 and then enters into the laser interferometer 120 that in turn measures the position of the reticle stage RS. The information on the position of the reticle stage RS is then inputted to a control circuit 140, and the control circuit 140 controls the position of the reticle R by driving a motor 119 for driving the reticle stage on the basis of the information on the position of the reticle stage RS.

On the other hand, the wafer W is held by and fixed on the wafer stage WS by means of a wafer holder 126 likewise in the case of the projection exposure apparatus as shown in FIG. 1. The wafer stage WS is disposed so as to move in a two-dimensional direction along the plane intersecting at a right angle with the paper plane of FIG. 5. The wafer stage WS is provided with a mirror 131 that reflects the laser beam from a laser interferometer 130 and enters it into the laser interferometer 130. The position of the wafer stage WS is then measured by means of the laser interferometer 130, and the information on the position of the wafer stage WS is then inputted to the control circuit 140 that in turn controls the position of the wafer W by driving a motor 129 for driving the wafer stage on the basis of the information on the position of the wafer stage WS. An illuminance sensor 128 is disposed on the wafer stage WS to detect the illuminance of the exposure light beam to be irradiated on the wafer W, and the signal detected by the illuminance sensor 128 is inputted to the control circuit 140.

In this embodiment according to the present invention, a light shielding plate 150 for opening and closing an exposure light path is disposed in the exposure light path between the light-leaving surface of the projection optical system PL and the top surface of the wafer stage WS. The light shielding plate 150 is transferred by means of a transferring device 151 in a horizontal direction along the top surface of the wafer stage WS. The transferring device 151 may be of any type, for example, of a type using a cylinder or of a type using a screw rod and a motor. As a clearance between the projection optical system PL and the wafer stage WS is so small, it is required to provide a rail or other means for guiding the light shielding plate 150 horizontally so as not to come into contact with the wafer W upon transferring the light shielding plate 150.

For the projection exposure apparatus in this embodiment according to the present invention, an illumination optical system 132 is composed of optical elements 104–107, 109, and 111–115, as described above, and they are accommodated together with the motor 108 and the sensor 110 in a housing member, although not shown. The housing member is filled with an inert gas such as nitrogen gas or configured so as for such an inert gas to flow through the inside. In other words, the illumination optical system 132 is disposed in an inert gas atmosphere such as a nitrogen gas atmosphere. At this end, the housing member for the illumination optical system 132 is provided with an inert gas supply device for supplying an inert gas to the housing member and an inert gas discharge device for discharging a contaminated inert gas from the inside of the housing member, although the devices are not shown. As the device as shown in FIG. 1, the device of FIG. 5 is configured such that a plurality of spaces formed among the plural optical members constituting the projection optical system PL is supplied with an inert gas such as nitrogen gas and the contaminated inert gas is discharged from the such plural spaces. At this end, there are disposed an inert gas supply device 141 for supplying an inert gas to the spaces and an inert gas discharge device 142 for discharging the contaminated inert gas therefrom. The inert gas supply device 141 supplies the inside of the projection optical system PL with an inert gas including, e.g., nitrogen gas, through a pipe 143. On the other hand, the inert gas discharge device 142 discharges the contaminated inert fluid present in the inside of the projection optical system PL toward the outside of the housing member through a pipe 144. As such an inert gas, there may be used a fluid such as helium and argon, although not limiting to nitrogen.

The exposure apparatus may be disposed in a clean room, and a light beam source 101 may be disposed under the floor of the clean room in many cases. An optical system for transmitting laser beams may be disposed between the main body of the apparatus and the laser beam source. The inert gas supply device 141 and the inert gas discharge device 142 may be disposed under the floor of the clean room. This disposition of these members can serve as reducing the disposition area per exposure apparatus in the clean room. In this case, it is not required to perform the maintenance of the inert gas supply device 141 and the inert gas discharge device 142 as well as the laser beam source 101, and the degree of cleanness can be sustained at a high level. It is further preferred that the inert gas supply device and the inert gas discharge device for the illumination optical system 132 are also disposed under the floor of the clean room in the like manner. Moreover, it is preferred that, for example, a temperature controller or an air conditioner for controlling the temperature within the chamber for accommodating the main body of the exposure apparatus are disposed under the floor of the clean room.

Now, a description will be made of the variable aperture stop device for changing the aperture number of the illumination optical system 132 for the projection exposure apparatus. As shown in FIG. 5, a σ value as a coherence factor can be defined by the following equation:

$$\sigma = NAi/NAo$$

where NAi (=sin θi) is the aperture number of the illumination optical system 132 to be determined by the light beam Ri parallel to the optical axis AX from the outermost edge (outermost diameter) of the maximal stop disposed in the turret plate 107; and NAo (=sin θo) is the aperture number of the projection optical system PL on the side of the illumination optical system 132 to be determined by the light beam Ro parallel to the optical axis AX from the outermost edge (outermost diameter) of the aperture stop Ep of the projection optical system PL.

It is to be noted that the aperture stop Ep disposed at the position of the pupil (the light-entering pupil) of the projection optical system PL is optically conjugated with the variable aperture stop on the turret plate 107 of the illumination optical system 132 and that an image of the variable aperture stop (an image of a secondary light source) is formed on the pupil of the projection optical system PL. Therefore, the σ value as the maximal coherence factor can be defined by the equation as follows:

$$\sigma = D7/D23$$

where D7 is the diameter of the image of the variable aperture stop; and

D23 is the maximal diameter of the aperture stop Ep of the projection optical system PL.

Generally speaking, the σ value of the projection exposure apparatus for use in the photolithography process is configured so as to be set in the range of 0.3 to 0.8. In this embodiment, the turret plate 107 as shown in FIG. 5 is provided with plural aperture stops 107a to 107h, inclusive (see FIG. 6), as in the case of the turret plate 13 as shown in FIG. 1. The suitable aperture stop is selected in accordance with usage in a manner as will be described hereinafter.

The turret plate 107 may be composed of a transparent substrate made of quartz for example as in the case of the turret plate 13 of FIG. 2. The turret plate 107 may be provided with eight aperture stop 107a to 107h, inclusive. Out of the eight aperture stops, five aperture stops 107a and 107e to 107h having each a circular aperture are arranged so as to positively vary the σ value, and the three aperture stops 107e, 107f and 107g out of the five aperture stops are each for use at the time of the actual exposure operation while the remaining two aperture stops 107a and 107h are each for use at the time of the optically cleaning operation.

On the other hand, the three aperture stops 107b to 107d. inclusive, each having a modified aperture, are each for use at the time of the exposure operation in order to improve the resolving power of the projection optical system PL. The aperture stops 107c and 107d are stops each having a zonal aperture with a different zonal ratio, while the remaining aperture stop 107b is the stop having four eccentric apertures for forming four eccentric secondary light sources.

The turret plate 107 having the eight aperture stops 107a to 107h is rotated by means of a motor 108 as shown in FIG. 5, and the one aperture stop that has a desired aperture shape is selected out of the eight aperture stops, and it is set at the position of the secondary light beam source. The driving of the motor 108 is controlled by the control circuit 140.

Figure 7:
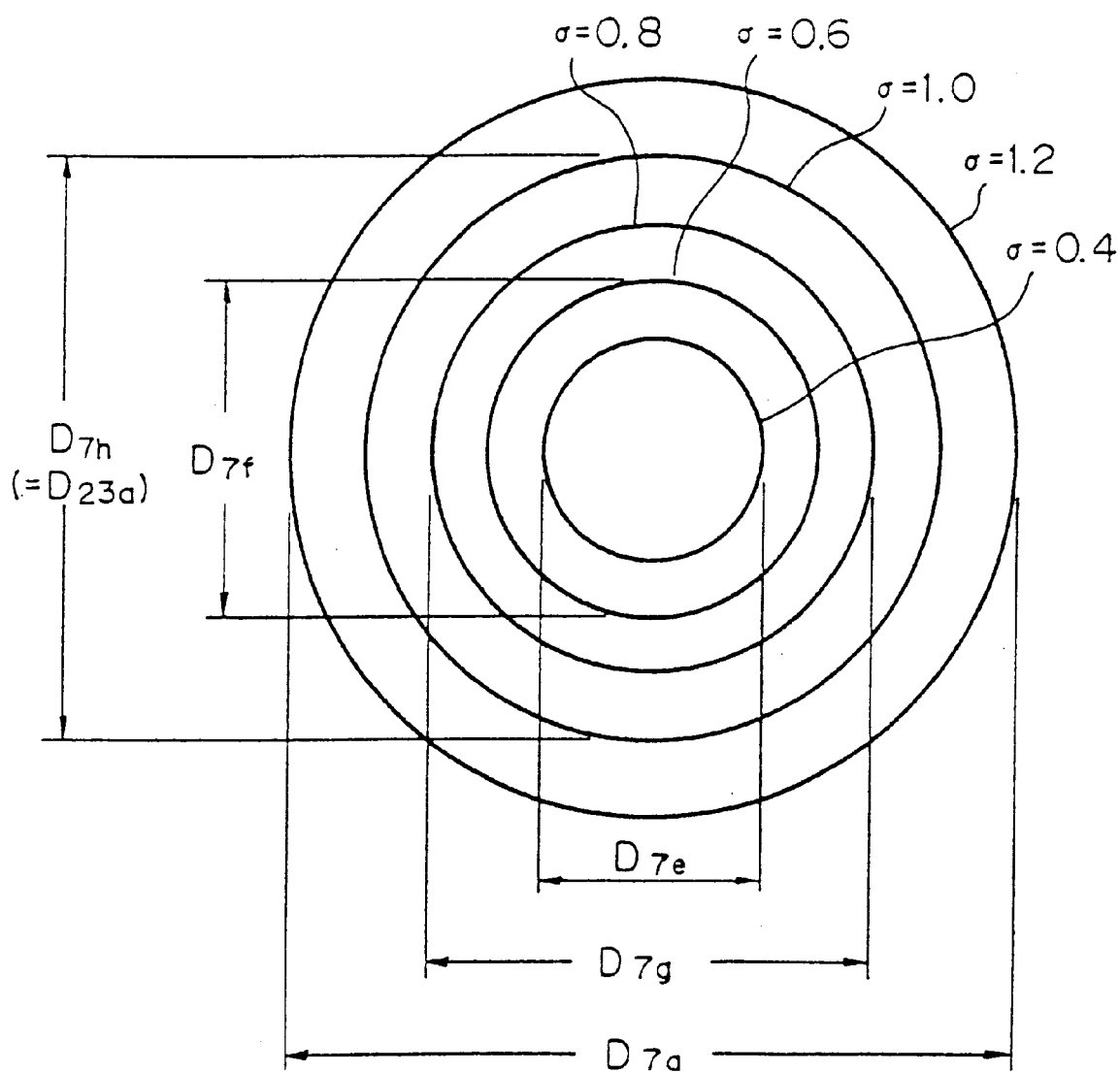
FIG. 7 is a view showing the status of the variable aperture stop disposed in an illumination optical system at a pupil position of a projection optical system of the projection exposure apparatus as shown in FIG. 5.

FIG. 7 shows the manner in which the images of the aperture stops 107a and 107e to 107h, each having a circular aperture with a different aperture size, are formed on the aperture stop Ep disposed within the projection optical system PL. A detailed description will be made of each of the aperture stops in manners (1) to (5) below.

(1) When the aperture stop 107e having the smallest circular aperture is set in the illumination light path, the aperture number NAi of the aperture stop 107e becomes the smallest. At this time, an image of the aperture stop 107e having an aperture diameter D7e is formed in the inside of the aperture stop Ep having an aperture diameter D23a, and the σ value is set to be 0.4. In other words, there can be established the relationships as follows:

$$\sigma = D7e/D23a = NAi/NAo = 0.4.$$

Therefore, when the aperture stop 107e is set in the illumination light path, the pattern of the reticle R can be transferred on the wafer W at the σ value of 0.4.

(2) When the aperture stop 107f having a circular aperture larger than that of the aperture stop 107e is set in the illumination light path, the aperture number NAi of the illumination optical system 132 becomes larger than when the aperture stop 107e is set in the illumination light path. At this time, an image of the aperture stop 107f having an aperture diameter D7f is formed inside the aperture stop Ep having the aperture diameter D23a, and the σ value is set to be 0.6. In other words, there can be established the relationships as follows:

$$\sigma = D7f/D23a = NAi/NAo = 0.6.$$

Therefore, when the aperture stop 107f is set in the illumination light path, the pattern of the reticle R can be transferred on the wafer W at the σ value of 0.6.

(3) When the aperture stop 107g having a circular aperture larger than the aperture stop 107f is set in the illumination light path, the aperture number NAi of the illumination optical system 132 becomes larger than when the aperture stop 107f is set in the illumination light path. At this time, an image of the aperture stop 107g having an aperture diameter D7g is formed inside the aperture stop Ep having the aperture diameter D23a, and the σ value is set to be 0.8. In other words, there can be established the relationships as follows:

$$\sigma = D7g/D23a = NAi/NAo = 0.8.$$

Therefore, when the aperture stop 107g is set in the illumination light path, the pattern of the reticle R can be transferred on the wafer W at the σ value of 0.8.

(4) When the aperture stop 107h having a circular aperture larger than that of the aperture stop 107g is set in the illumination light path, the aperture number NAi of the illumination optical system 132 becomes larger than when the aperture stop 107g is set in the illumination light path. At this time, there is formed an image of the aperture stop 107h having an aperture diameter D7h as large as the aperture stop Ep having the aperture diameter D23a, and the σ value is set to be 1.0. In other words, there can be established the relationships as follows:

$$\sigma = D7h/D23a = NAi/NAo = 1.0.$$

Therefore, when the aperture stop 107h is set in the illumination light path, the illumination light flux is led adequately to the effective diameter of the optical element constituting the condenser optical system 115 of the illumination optical system 132, and to the effective diameter of the optical elements constituting the projection optical system PL, and further to a portion that exceeds the effective diameters of these optical elements. Thus, impurities such as water moisture, organic materials, etc. attached to the surfaces of the optical elements can be removed by the optically cleaning effects achieved by the exposing illumination light flux. The optically cleaning effects will be described more hereinafter.

(5) When the aperture stop 107a having a circular aperture larger than that of the aperture stop 107h is set in the illumination light path, the aperture number NAi of the illumination optical system 132 becomes larger than when the aperture stop 107h is set in the illumination light path. At this time, an image of the aperture stop 107a having an aperture diameter D7a is formed so as to contain the aperture stop Ep having the aperture diameter D23a, and the σ value is set to be 1.2. In other words, there can be established the relationships as follows:

$$\sigma = D7a/D23a = NAi/NAo = 1.2.$$

Therefore, when the aperture stop 107a is set in the illumination light path, the pattern of the reticle R can be transferred on the wafer W at the σ value of 1.0. Therefore, when the aperture stop 107h is set in the illumination light path, the illumination light flux is led adequately to the effective diameter of the optical element constituting the condenser optical system 115 of the illumination optical system 132, to the effective diameter of the optical elements constituting the projection optical system PL, and to the effective diameter of these optical elements, as well as to the peripheral edge portion that exceeds the effective diameters of the optical elements. Thus, the effects of optically cleaning impurities such as water moisture, organic materials, etc. attached to the surfaces of the optical elements can be achieved to a sufficient extent.

Then, the operation of the projection exposure apparatus in this embodiment will be described hereinafter. First, as shown in FIG. 5, dry inert gases such as nitrogen are supplied to the inside of the projection optical system PL through the pipe 143 from the inert gas supply device 141, the inside of the projection optical system PL is fully filled with the gases, and the gases present inside the projection optical system PL are discharged outside through the pipe 144 by means of the inert gas discharge device 142. The entire length of the light path for the exposure light beam of the illumination optical system 132 is made of a closed structure as the projection optical system PL, and a dry inert gas such as nitrogen, etc. is likewise supplied and filled, while gases inside the light path are discharged through the inert gas discharge device.

It is preferred that the inert gas supply device 141 and the inert gas discharge device 142 are operated all the time during the exposure, too, and the atmosphere among the optical elements such as lens chambers, etc. is held always in a dry and clean state. However, the operations of the inert gas supply device 141 and the inert gas discharge device 142 may be suspended after cleaning the gases present in the spaces formed among the optical elements such as lens chambers prior to the exposure operation. The same thing can be applied to the illumination optical system 132.

Then, the reticle R with a pattern drawn as an object for transfer is transported and loaded on the reticle stage RS by means of a reticle loading mechanism, although not shown. The position of the reticle R is then measured by a reticle alignment system, although not shown, so as for the reticle R to be loaded at a predetermined position. The position of the reticle R is set at a predetermined position on the basis of this result by means of a reticle position control circuit, although not shown.

The wafer W is coated in advance at its surface with a photoresist as a photosensitive material, and the wafer W is then transferred with the pattern of the reticle R. The wafer W coated with the photoresist is then transported and loaded on the wafer stage WS by means of a wafer loading mechanism, although not shown. Thereafter, the wafer W is aligned, held and fixed on the wafer stage WS. For the wafer W loaded on the wafer stage WS, no pattern is present on the wafer W upon transfer of the pattern of the reticle of a first layer, and the wafer W is loaded on the wafer stage WS at a predetermined position, i.e., at a position determined by its outer diameter (OF or notch) as a reference. Thereafter, the pattern on the wafer W is transferred in a step-and-repeat manner or in a step-and-scan manner. This transfer is of a so-called scan type that selectively illuminates a portion of the pattern on the reticle R by means of a reticle blind, although not shown, transfers the reticle R by means of the reticle stage RS, and moves the wafer W by means of the wafer stage WS in synchronism with the reticle stage RS. The transfer may also be performed in a step-and-repeat system that illuminates and transfers all the entire area of the pattern on the reticle R so as to transfer the pattern in a state in which the reticle R and the wafer W are in a static state.

In the case of transcribing the patterns of the second layer and et seq. onto the wafer W, the position of the wafer W is measured by measuring an alignment mark formed next to the pattern transferred in advance by means of a wafer alignment system, although not shown, because the pattern is present at least on the wafer W. On the basis of the result of this measurement, the positions of the reticle stage RS and the wafer stage WS are controlled so as to accurately superimpose the pattern being transferred over the previously transferred pattern on the wafer W.

The reticle stage RS and the wafer stage WS are transferred at a constant velocity at a velocity ratio in accordance with the projection magnification of the projection optical system PL during the scanning exposure. For instance, if the size of each pattern on the wafer W would vary due to thermal transformation of the wafer W or if the pattern would be transformed (deviated), an error in magnification between the pattern on the wafer W and the pattern image of the reticle in the scanning direction may be corrected by varying the velocity ratio so as to differ from the projection magnification. On the other hand, an error of magnification with respect to a non-scanning direction (in a direction intersecting at a right angle with the scanning direction) can be corrected by transferring at least one lens element (for example, a lens element located nearest to the reticle R) of the projection optical system PL. Further, for a deviation of the pattern, an error in the superimposition of the pattern on the wafer over the pattern image of the reticle can be decreased by adjusting the magnification in the manner as described above. The shape of the pattern on the wafer may also be corrected by slightly deviating the positions of the wafer and the reticle in each scanning direction.

In a usual exposure process, sheets m of wafers W with several ten exposure regions (shot regions) set for each wafer are subjected to exposure as one lot. Usually, the laser beam is blocked by the shutter 102 located between the laser beam source 101 and the light transmitting window 103 by the shutter 102 in such a manner that the laser beam is not irradiated on the wafer stage WS for the time for exchanging wafers W, the time between shots, or the time for exchanging reticles. In this embodiment, the fluctuation in the transmittance is controlled by self-cleansing the optical system by irradiating the illumination optical system 132 and the projection optical system PL with the laser beam during such a non-exposure time.

It is to be noted herein that the time for exchanging wafers W, the time between shots, or the time for exchanging reticles is usually a non-exposure time during the exposure process yet it is an essential time for the step for exposing one sheet of water or one lot of wafers. Therefore, the term "non-exposure time" referred to in the description of this specification is intended to mean a non-exposure time that is essential during the exposure process.

Figure 8:
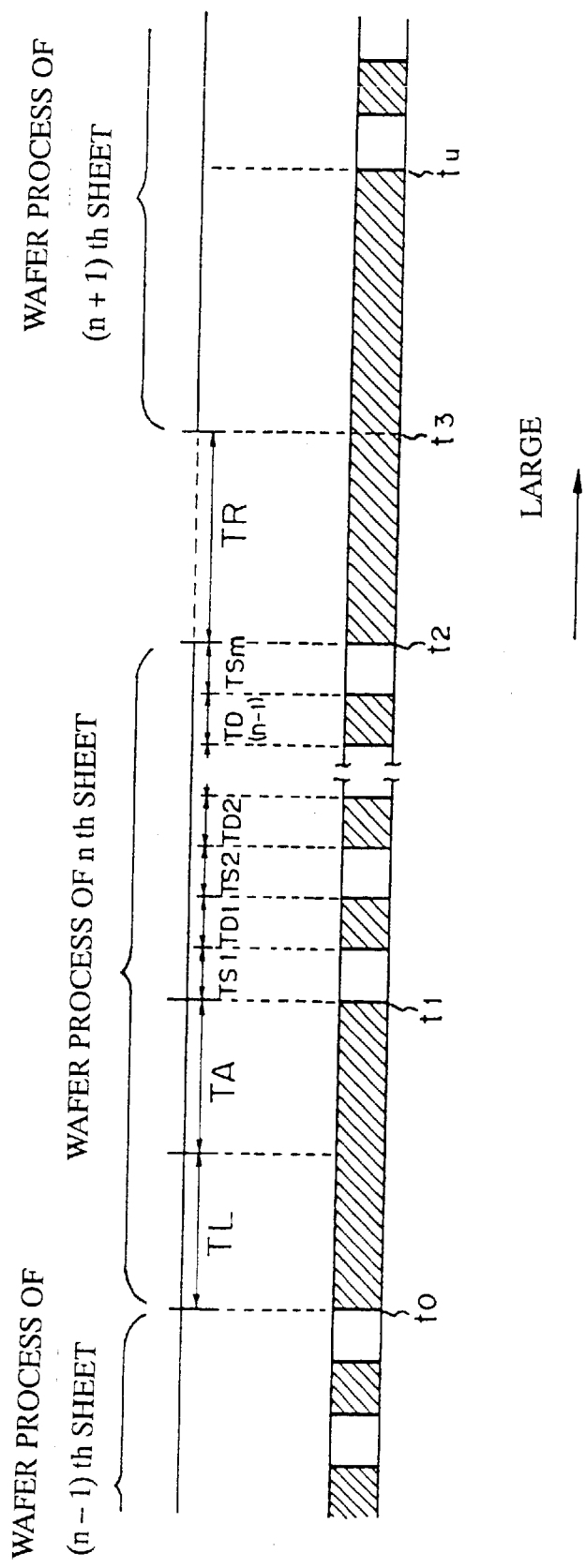
FIG. 8 is a time chart showing an exposure process.

FIG. 8 is a time chart in the case where sheets m (m>n) of wafers W in one lot are exposed. At time t0, the wafer W of the (n−1)-th sheet is unloaded, and the wafer W of the n-th sheet is loaded. The time required for unloading and loading is indicated by reference symbol TL, and the wafer W is then aligned on the wafer stage WS. Thereafter, the wafer stage WS is transferred so as to allow the wafer W to agree with the optical axis of the projection optical system PL in order to let the first shot region reach the position of starting the exposure. The time required for these operations is indicated by reference symbol TA. These times TL and TA are each a non-exposure time, and the illumination optical system 132 and the projection optical system PL are irradiated with the laser beam upon insertion of the light shielding plate 150 into the exposure light path without blocking the laser beam with the shutter 102 in a conventional manner, and those optical systems are self-cleansed during such a non-exposure time.

In other words, as the light shielding plate 150 is inserted in the light path at the time to when the last shot on the (n−1)-th sheet of the wafer W is finished, the light path is blocked by means of the shutter 12. This operation is controlled by means of the control circuit 140. Upon confirmation that the insertion of the light shielding plate 150 has been finished, the shutter 102 is opened by means of the control circuit 140. As the laser pulse beam is emitted from the laser beam source 101, the illumination optical system 132 and the projection optical system PL are irradiated with the cleaning light beam to perform the self-cleansing. In this case, however, the wafer W is not irradiated. The laser beam quantity in this case may be as much as capable of controlling a reduction in the transmittance of the illumination optical system 132 and the projection optical system PL, and it is preferred that a decrease in the durability of the laser beam source is prevented by adjusting the interval and intensity of emitting the laser pulse beam from the laser beam source 101. In other words, the laser beam quantity required for optically cleaning the optical system may be smaller than the laser beam quantity required for usual exposure.

Specifically, when the intensity (illuminance) of the laser pulse beams on the wafer W is set to be 0.1 mJ/cm$^2$, it is found that the decrease in transmittance can be controlled sufficiently as about twenty pulses are oscillated. The intervals of oscillating the pulse laser beams and the intensity of the laser beam on the wafer W during the optical cleaning adjusts the intervals of oscillating the laser beam by adjusting the intervals (frequency) of oscillating trigger pulses outputted to the laser beam source 101 and varying voltage (charging voltage) to be applied to the laser beam source 101. In usual cases, a turret plate with plural ND filters each having a different transmittance is disposed in the illumination optical system 132, and, for instance, rotated to select and locate one ND filter corresponding to the photosensitivity of a photoresist coated on the wafer, if the sensitivity varies to a great extent, thereby adjusting the light intensity per pulse. When the intensity of the pulse beams varies greatly upon the optical cleaning, the turret plate may be disposed so as to be rotated or the oscillation intensity of the laser beam source 101 as described above may be adjusted in combination with the rotation of the turret plate.

Then, the exposure to the wafer W is started from the time t1. First, the laser beam left from the laser beam source 101 is shielded by the shutter 102 before the time t1, and the light shielding plate 150 is evacuated from the light path. The pattern of the reticle R is subjected to projection exposure onto the wafer W of the n-th sheet from the time t1 by repeating the shot exposure and the transfer of the stage in a conventional manner. As shown in FIG. 7, the time for shot exposure is indicated by TS1 to TSm, inclusive, and the time for transferring the stage is indicated by TD1 to TD(m−1), inclusive. During the time for transferring the stage, TD1 to TD(m−1), i.e., the time between the shots, the self-cleansing of the optical system can be effected by inserting the light shielding plate 150 and irradiating with the laser beam up to the projection optical system PL. It is to be noted herein, however, that the time for inserting the light shielding plate 150 into the light path and the time for evacuating it from the light path have to be taken into account and that throughput is caused to be decreased in the case where this time is longer than the time TD for transferring the stage in order to select (align) the shot region. Therefore, it is practical that the self-cleansing is performed even during the non-exposure time between shots only when the requirement for controlling the fluctuation in the transmittance is sought greatly even if the influence would be exerted greatly due to the fluctuation in the transmittance of the optical system and throughput would be caused to be decreased.

Then, the operation for exchanging the reticle R is started at the time t2, and reticles are exchanged for the time TR. The period of time during which the reticles are exchanged is a non-exposure time. The light shielding plate 150 is inserted into the light path, and the light path up to the projection optical system PL is irradiated with cleaning light beam. The wafer W of the (n+1)-th sheet is loaded and aligned from the time t3, and the exposure to the wafer W of the (n+1)-th sheet is started from the time t4.

By irradiating the illumination optical system 132 and the projection optical system PL with the exposure light beam while prohibiting the entry of the exposure light beam into the wafer W during the non-exposure time, contaminants such as water moisture or organic materials detached from the surfaces of the optical systems and floating in the atmosphere inside the light path are not caused to be attached to the surfaces of the optical systems while remaining such contaminants floating in the atmosphere. As a consequence, the transmittance of the optical system can be held at a predetermined value. Further, the such optical cleaning can improve throughput to a greater extent, as compared with the case where the optical cleaning is performed by setting the time unnecessary for the original exposure process, because it is carried out during the non-exposure time essential for the usual exposure process, that is, the time for exchanging the wafers W, the time between the shots or the time for exchanging the reticles. In addition, it is not required that the wafer stage WS is transferred so as to depart the wafer W from the exposure region during the optically cleaning processing, because the wafer W is not exposed while the wafer W is left located in the region of irradiating the projection optical system PL with the exposure light beam. Further, this operation exerts no influence upon throughput in the respect, too. Moreover, the optical cleaning can be likewise effected simultaneously even during the alignment operation for determining the coordinate position of each pattern by detecting a mark on the wafer W by means of an off-axis alignment sensor, and the decrease in throughput can be prevented.

It is further preferred that the plane of the light shielding plate 150 on the projection optical system side is a mirror plane. As described above, it is preferred that the laser beam is emitted from the laser beam source 101 for use upon exposure even during the non-exposure time and the illumination optical system 132 and the projection optical system PL are subjected to self-cleansing during the non-exposure time by irradiation with the exposure light beam. The self-cleansing effects can be improved much more by reflecting the exposure light beam entered into the light shielding plate 150 at this time and re-entering the reflected light into the projection optical system PL. Therefore, this operation can contribute to further improvements in the durability of the laser beam source 101 by lowering the quantity of the laser beam or located a pulse time interval.

The foregoing description is directed to the light shielding plate 150 of a movable type. It is also possible to use a liquid crystal so arranged as to open and close the light path, in place of the light shielding plate 150, or to use a system of a type that can fully close the aperture stop Ep disposed in the projection optical system PL to close the light path. In the latter case, the optical systems disposed on the side (wafer side) downstream from the aperture stop Ep cannot be subjected to self-cleansing during the non-exposure time, however, no big influences are exerted upon the fluctuation in transmittance of the projection optical system PL because a majority of the optical systems of the projection optical system PL are disposed in the light path extending from the light-entering plane to the aperture stop Ep.

Further, in the case where the self-cleansing is performed by irradiating the illumination optical system 132 and the projection optical system PL with the exposure light beam during the non-exposure time, it is preferred that an aperture stop having a large σ value, such as the aperture stop 107a or 107h, is selected by means of the control circuit 140. Moreover, in the case where the light path is shielded by a system of type shielding by means of the light shielding plate 150, it is preferred that the control circuit 140 controls so as to increase the quantity of the cleaning light beam entering into the optical system disposed on the downstream side from the aperture stop Ep by making the size (aperture diameter) of the aperture stop Ep of the projection optical system PL larger in association with the shifting to the aperture stop 107a or 107h.

Then, a description will be made of a modification of the light shielding plate 150 as shown in FIG. 5 with reference to FIGS. 9 to 13.

In this modification, the light shielding plate 150 is disposed so as to incline a normal line of the reflecting plane thereof with respect to the optical axis AX of the projection optical system PL. This modification permits reflected light beam to enter into a region (in this example, a region of a lens plane of a lens constituting the projection optical system PL) which is different from the area where the light shielding plate 150 with the normal line of its reflecting plane inclined is not used. Thus, even in the case where a coherence factor σ is σ<1 as in a conventional projection exposure apparatus, all regions of the effective diameter of the lens constituting the projection optical system PL can be illuminated with the exposure light beam.

Figure 9:
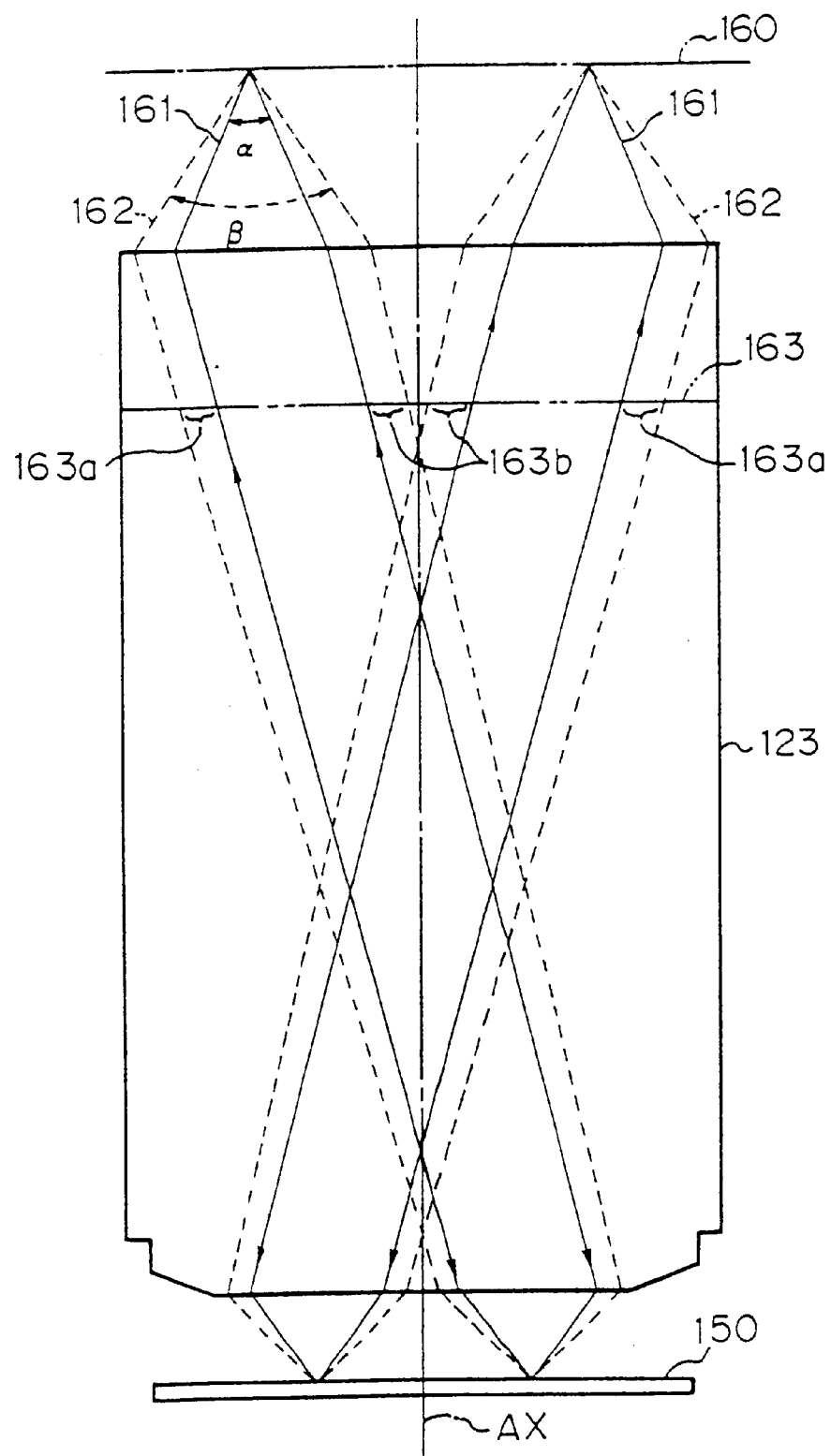
FIG. 9 is a view describing a light path inside the projection optical system of FIG. 5.

FIG. 9 describes a state of the light path in the projection optical system PL when the exposure light beam is reflected by means of the light shielding plate 150 disposed so as to allow the normal line of its reflecting plane to agree with the optical axis AX of the projection optical system PL. In FIG. 9, the position of the reflecting plane of the light shielding plate 150 is shown to agree with the wafer plane and the aperture stop Ep is omitted for ready reference. In FIG. 9, reference numeral 161 denotes a light flux of the exposure light beam which is left from a reticle-loading plane 160 that agrees with the pattern plane of the reticle, in the case where no reticle R is loaded thereon, and which is left from two points on the reticle-loading plane 160. On the other hand, in the case where the reticle R is loaded on the reticle-loading plane 160, the exposure light beam is diffracted by means of the reticle R and the diffracted light beam is left from the reticle-loading plane 160 at an angle larger than an aperture angle α (an aperture angle of the illumination optical system) of the light flux 161. It is to be noted herein, however, that out of the diffracted light beam left from the reticle-loading plane 160, only the exposure light beam passing through the aperture stop Ep of the projection optical system PL is irradiated onto the wafer, so that an aperture angle β of a light flux 162 of the diffracted light beam comes into agreement with the aperture angle of the projection optical system PL.

As shown in FIG. 9, when the normal line of the reflecting plane of the light shielding plate 150 agrees with the optical axis AX of the projection optical system PL, the reflected light beam travels through the light path in the reverse direction. As a consequence, for instance, when a lens plane as indicated by reference numeral 163 is located in the projection optical system PL, no exposure light beam is irradiated onto portions as indicated by reference numerals 163a and 163b. If the light flux 161 as shown in FIG. 9 would be located at the position farthest from the optical axis AX on the reticle-loading plane 160, the light flux located at the position nearest to the optical axis AX enters into the portion 163b and consequently the portion located at the position farther from the optical axis cannot be subjected to self-cleansing. As described above, in the case where the coherence factor a is σ<1 and the reticle R is not loaded on the reticle stage RS, a portion of the effective diameter of the projection optical system is not subjected to self-cleansing, for instance, when the optical system of a conventional exposure apparatus is to be self-cleansed immediately after maintenance.

Figure 10:
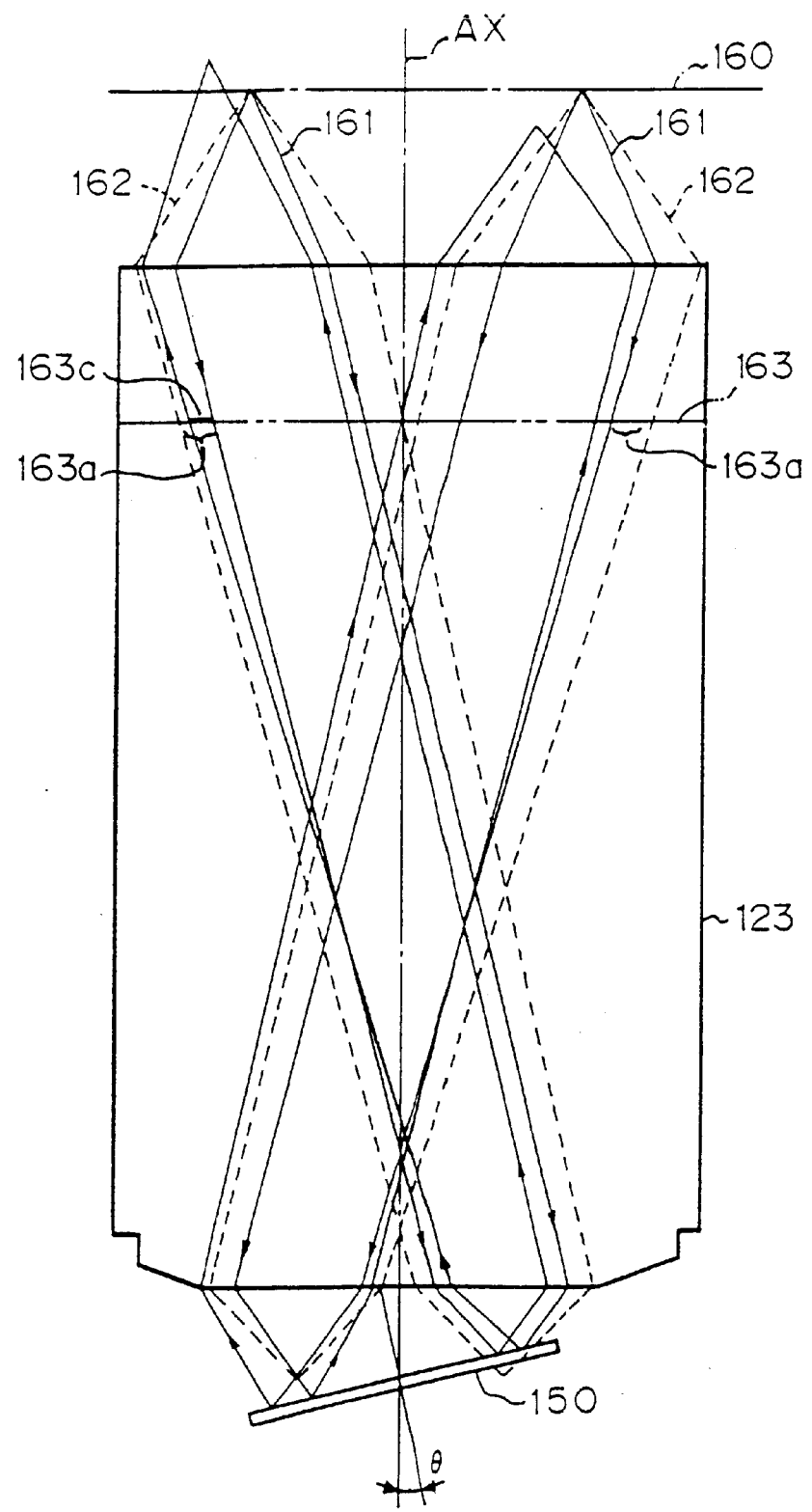
FIG. 10 is a view describing a light path in a state in which a light shielding plate of FIG. 5 is inclined.
Figure 11:
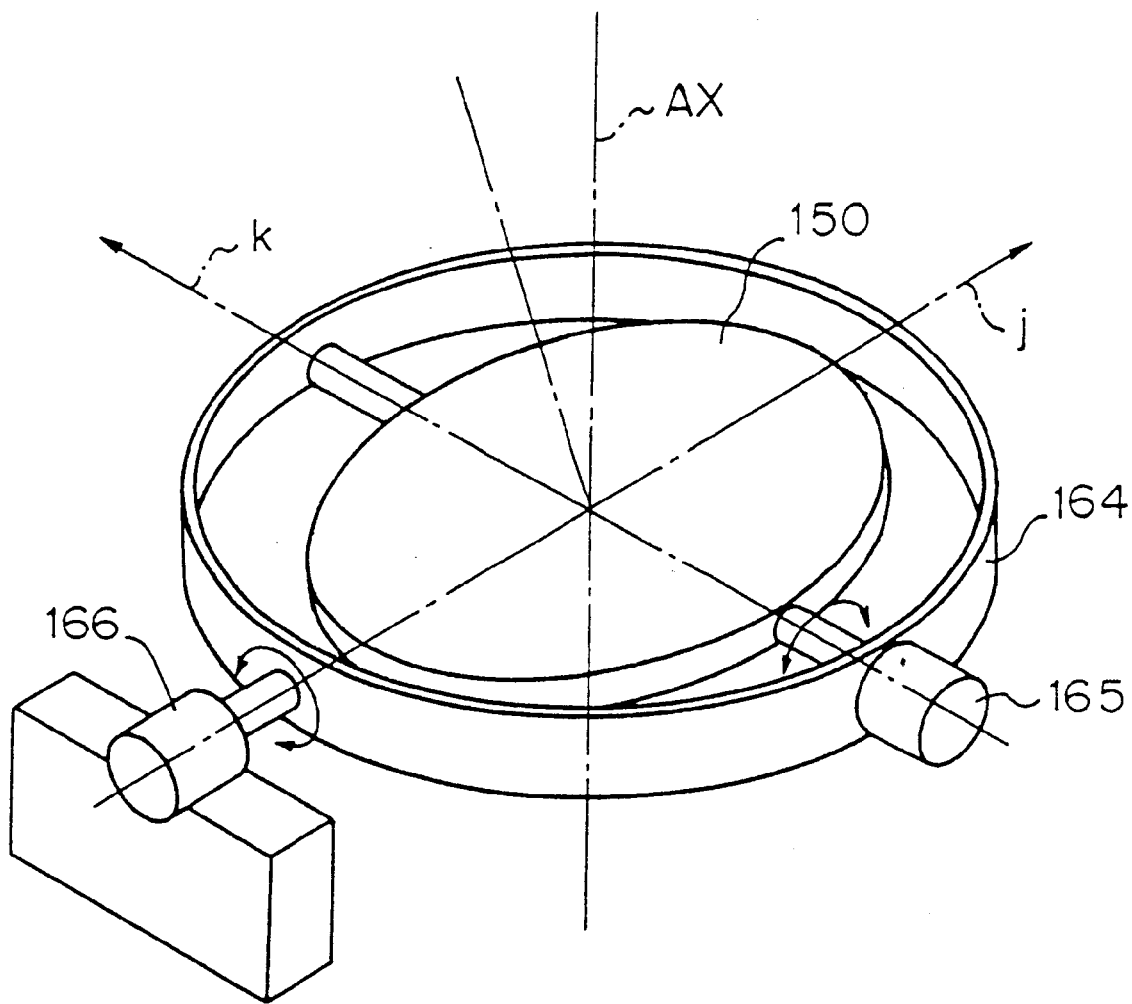
FIG. 11 is a perspective view showing a light shielding plate.

If the light shielding plate 150 would be inclined by an angle θ as shown in FIG. 10, the light path of the reflected light beam is changed and a portion 163c of the portion 163a located on the left side of the drawing is irradiated with the reflected light beam. Further, when the light shielding plate 150 is inclined by an angle θ in the reverse direction, the reflected light beam enters into a portion of the portion 163a on the right side of the drawing. FIG. 11 shows the light shielding plate 150 that is arranged so as to be inclined in a variable manner. As shown in FIG. 11, the light shielding plate 150 can be inclined by rotating it about an axis k by means of a motor 165 fixed to a frame 164 and the frame 164 can also be inclined by rotating it about an axis j by means of a motor 166. For the optical cleaning, the irradiation with the exposure light beam is performed by swinging the light shielding plate 150 and the frame 164 by means of the respective motors 165 and 166.

Figure 12:
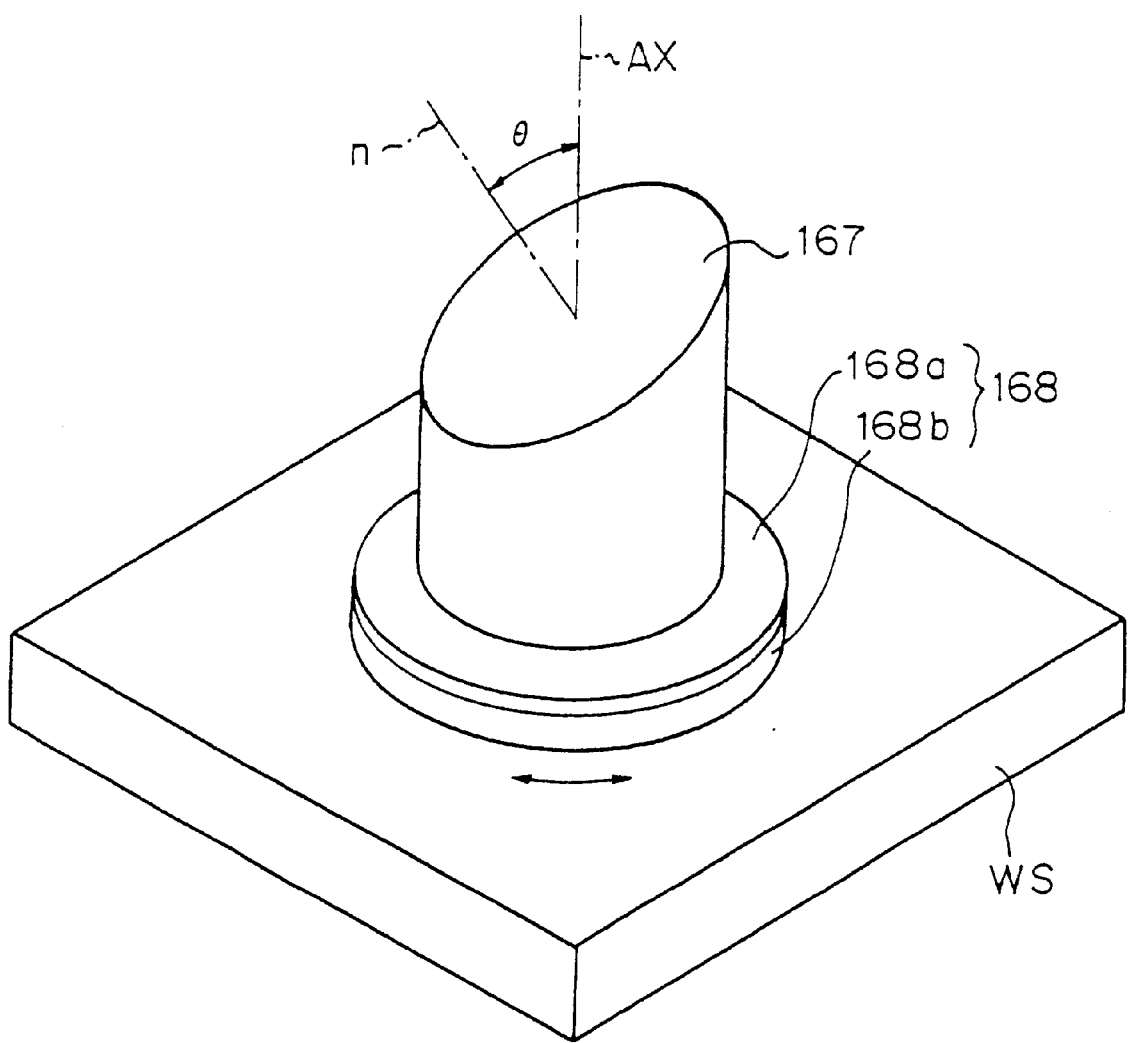

In such a state that the reticle R is not loaded on the reticle stage RS in the manner as described above, that is, that the reticle R is not located on the reticle-loading plane 160 as shown in FIG. 9, the optical cleaning is effected, for example, immediately after the time (as indicated by reference symbol TR in FIG. 8) for exchanging reticles, immediately after the time for installing the exposure apparatus, at the time of starting-up the apparatus after a long-term suspension of operation, and immediately after the time for installing the apparatus. In almost all the above cases, however, the wafer W is not loaded on the wafer stage WS. Therefore, the exposure light beam may be set so as to be reflected by means of a reflection mirror 167 as shown in FIG. 12, in place of the light shielding plate 150. In FIG. 12, the normal line n of the reflecting plane of the reflection mirror 167 is set so as to amount to a predetermined angle Θ with respect to the optical axis AX. The angle Θ is further set so as to permit the exposure light beam to be irradiated onto the entire area of the effective diameter of the projection optical system PL. The reflection mirror 167 is fixed on a rotary portion 168a of a rotary stage 168, and a fixing portion 168b of the rotary stage 168 is fixed on the wafer stage WS. Upon effecting the optical cleaning, the wafer stage WS is transferred so as for the center of the reflection mirror 167 to come into agreement with the optical axis AX, and the exposure light beam is then irradiated while rotating the reflection mirror 167 by driving the rotation of the rotary stage 168.

Figure 13:
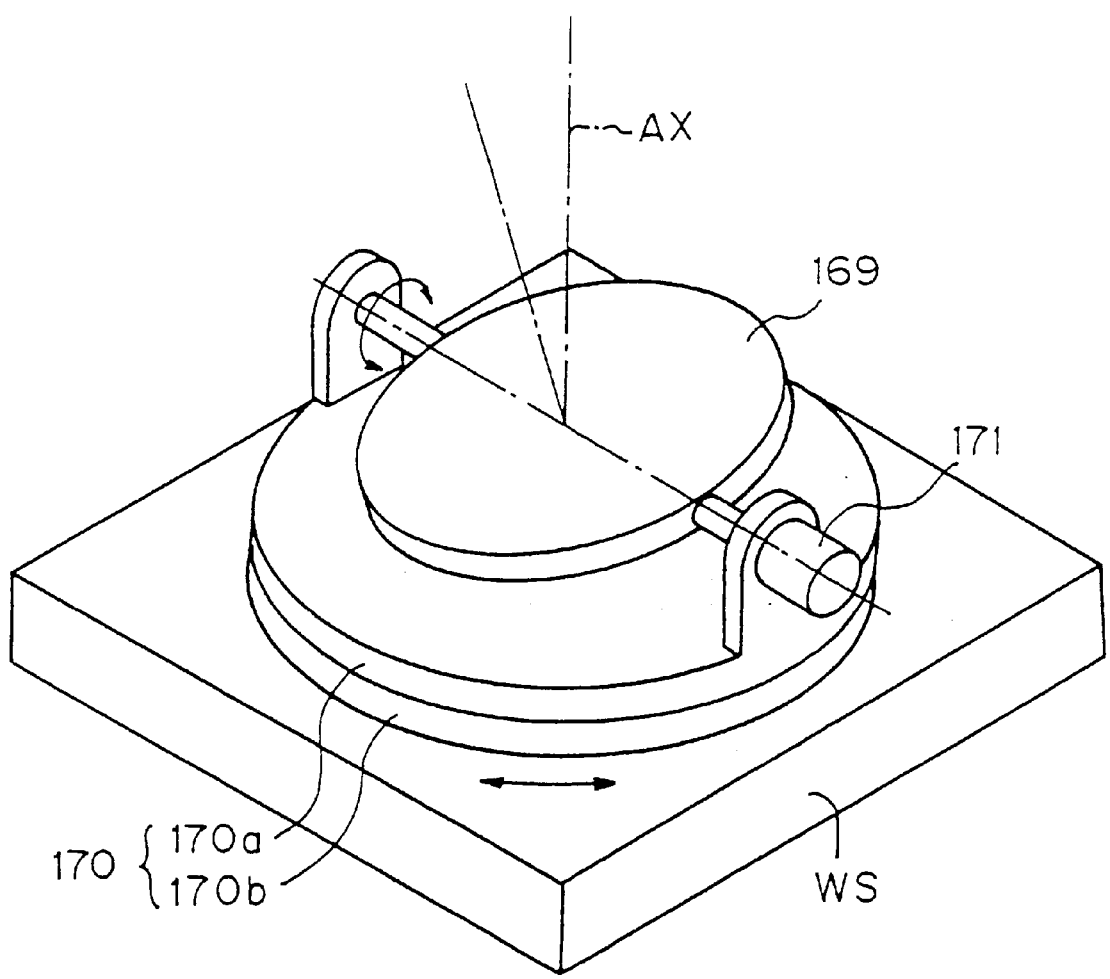
Figure 14:
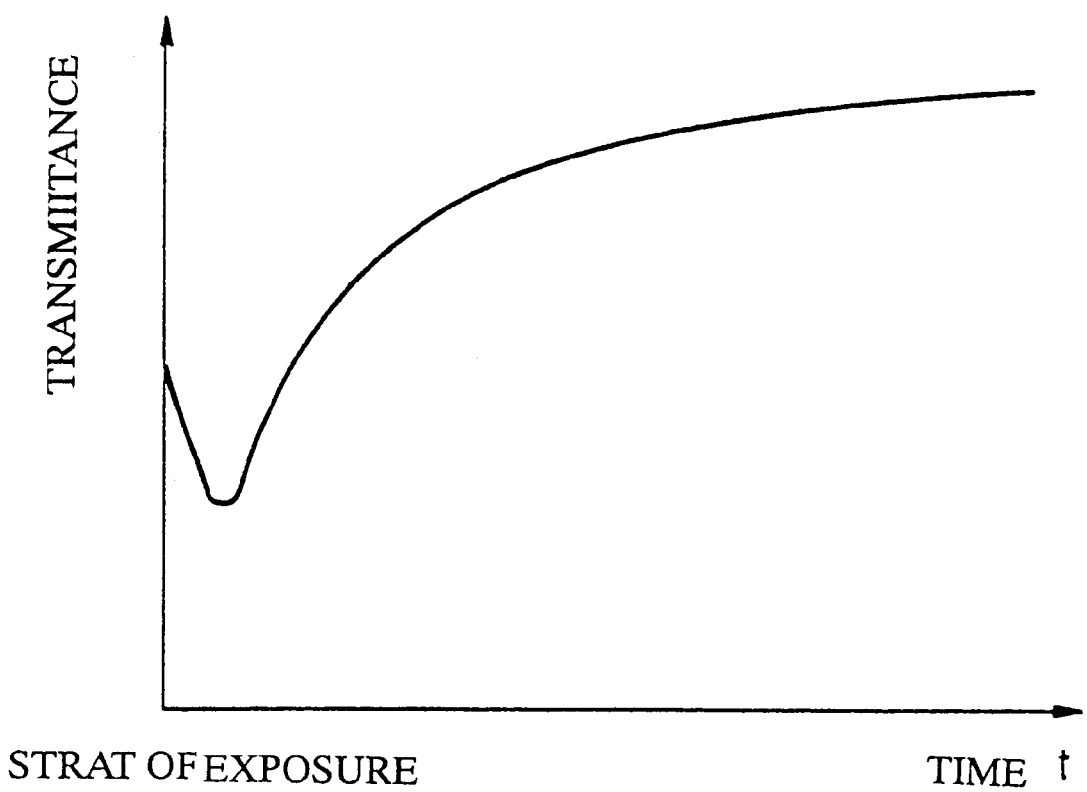
FIG. 14 is a graph describing a variation in the transmittance with an elapse of the exposure time.

FIG. 13 shows a modification of the reflection mirror. A reflection mirror 169 disposed in a rotary portion 170a of a rotary stage 170 is configured such that it can change an inclination angle by means of a motor 171 and that a fixing portion 170b of the rotary stage 170 is fixed on the wafer stage WS. Upon effecting the optical cleaning, the wafer stage WS is transferred so as for the center of the reflection mirror 169 to come into agreement with the optical axis AX and the exposure light beam is then irradiated while changing an inclination of the reflection mirror 169 in a vibration manner by driving the rotation of the rotary stage 170.

In the above modification of the reflection mirror, the reflected exposure light beam is entered into the projection optical system PL while varying the inclination of the reflecting plane thereof from which the exposure light beam is reflected, so that the optical cleaning can be performed on an area wider than the exposure area of the projection optical system PL determined by the aperture angle α (FIG. 9) of the illumination optical system. As a consequence, an irregularity of the light quantity of an imaging pattern caused by an irregularity of transmittance of the projection optical system PL can be reduced.

It can also be noted that the optical cleaning as described with reference to the embodiments of the present invention can also be applied immediately after the manufacturing of the projection exposure apparatus, immediately after the projection exposure apparatus has not been used for a long period of time, and in the case where the lens surface might be contaminated after the maintenance of the main body of the exposure apparatus.

Moreover, the exposure operation may be carried out in such a manner that the light shielding plate 150 is inserted into the light path before the start of the exposure, the light shielding plate 150 is then detached at predetermined time intervals during the exposure operation, the exposure operation is suspended temporarily, the transmittance of the projection optical system is measured from the light quantity of the light beam entering into the projection optical system PL and the light quantity of the light beam leaving therefrom, and the exposure operation is resumed thereafter by re-inserting the light shielding plate 150 into the light path. This exposure operation can perform the optical cleaning during which contaminated materials can be removed by the exposure light beam gradually from the lens surface of the optical system. The rise of the transmittance of the projection optical system can be confirmed from the result of the above measurement. Therefore, it can be decided whether the transmittance of the projection optical system is held at such a level that does not exert any influence upon the manufacturing process by effecting the optical cleaning while transmittance of the projection optical system is measured after the removal of the light shielding plate 150 in the manner as described above. In addition, as the transmittance of the projection optical system has reached the level that does not adversely affect the manufacturing process, the pattern of the reticle illuminated by means of the illumination optical system can be transferred onto the photosensitive substrate through the projection optical system. Thus, the timing of finishing the optical cleaning can also be confirmed by the level of the transmittance of the projection optical system.

In the embodiment according to the present invention, the optical cleaning for the projection optical system is described. It can be noted that the illumination optical system can be optically cleaned in substantially the same manner as the projection optical system can. In this embodiment, a description has been made of the configuration such that the light shielding plate 150 is inclined or rotated (swing) on the wafer stage WS. It is also possible that the light shielding plate 150 is loaded directly on the loading plane (the plane on which to load the photosensitive substrate) of the wafer stage WS and that the wafer stage WS itself is inclined or be rotated (swung). In this embodiment, there may be used a leveling stage for transferring the photosensitive substrate in the direction of the optical axis of the projection optical system and inclining the wafer at a predetermined angle in order to transfer the photosensitive substrate into the focal depth of the projection optical system. In this embodiment, however, a usual leveling stage may also be used for performing the optical cleaning particularly by varying the amount of inclination so as to enable reflecting the exposure light beam up to a region wider than the effective diameter of the projection optical system although such a usual leveling stage has a very trivial amount of inclination.

The embodiments according to the present invention have been described with reference to ArF excimer laser beam as the illumination light beam from the laser beam source. It can be noted herein that, as the illumination laser beam from the laser beam source, there may also be used, for example, an illumination laser beam of an ultraviolet wavelength region, such as KrF excimer laser beam (having a wavelength of 248 nm), $F_2$ laser beam (having a wavelength of 157 nm), and soft X-rays having a further shorter wavelength, including EUVL.

In the embodiments as described above, a description of the inert gas to be filled in the entire range of the light path has been made with reference to nitrogen gas. Other inert gases may also be used, which may include, for example, helium, neon, argon, krypton, xenon, radon. Preferably, there may be used a chemically clean and dry air (i.e., an air from which substances causing clouding a lens, for example, ammonium ions floating in the clean room, has been removed). Although the exposure apparatus according to the present invention is assembled by coupling a large number of structuring elements including the light shielding plate 50 with each other electrically, mechanically or chemically, the exposure apparatus can prevent a decrease in transmittance of the optical system and be subjected to the optical cleaning of the region wider than the effective diameter of the projection optical system.

The exposure apparatus according to the present invention is provided with the light blocking means for blocking the exposure light path between the projection optical system and the photosensitive substrate or in the inside of the projection optical system in the manner as described above, and the provision of the light blocking means can control a decrease in the transmittance of the optical system by irradiating the illumination optical system or the projection optical system with the exposure light beam during the non-exposure time essential for the exposure process. With this configuration, the exposure apparatus of this invention does not require the photosensitive substrate to be transferred from the irradiation region whenever the irradiation with the exposure light beam is effected, so that defects upon exposure can be prevented from occurring due to the lack of the exposure light quantity on the photosensitive substrate immediately after the exchange of wafers or reticles, without causing any decrease in throughput.

When the projection optical system is provided with the variable aperture stop, the variable aperture stop can prevent the entry of the exposure light beam into the photosensitive substrate so that a new element or device for blocking the exposure light beam is not required to be provided by fully closing the variable aperture stop.

Moreover, when the plane of the light shielding plate into which the exposure light beam enters is disposed so as to constitute the reflecting plane, the exposure light beam is reflected and re-entered into the projection optical system or the illumination optical system. The light quantity of the light beam required for the optical cleaning during the non-exposure time can be reduced to contribute the durability of the laser beam source.

Upon effecting the optical cleaning during the non-exposure time, even a peripheral area of the optical system can also be optically cleansed by enlarging the variable aperture stop of the illumination optical system than a stop to be set for usual exposure.

Furthermore, a wider area of the effective diameter of the projection optical system can be optically cleansed by varying the inclination of the reflecting plane. In addition, upon effecting the optical cleaning during the non-exposure time, a peripheral area of the optical system can be cleansed by setting the variable aperture stop of the illumination optical system to be larger than the stop to be set for usual exposure. Further, an area of the projection optical system wider than the irradiation area of to be determined by the aperture angle of the illumination optical system can be optically cleaned by permitting the entry of the reflected exposure light beam into the projection optical system while varying the inclination of the reflecting plane at which the exposure light beam is reflected.

What is claimed:

1. An exposure apparatus which projects an image of a pattern formed on a mask onto a substrate by irradiating the mask with an exposure light beam, the exposure apparatus comprising:

a plurality of optical elements disposed between a light beam source which emits the exposure light beam and the substrate; and a light shielding device which blocks a cleaning light beam which has passed through a part of the optical elements when the part of the optical elements are optically cleaned, the light shielding device being disposed, relative to the part of the optical elements, on a light leaving side on which the cleaning light beam leaves the part of the optical elements.

2. The exposure apparatus according to claim 1, wherein:

the part of the optical elements are arranged so as to be shifted between a position in a light path of the exposure light beam and a retraction position retracted from the light path, and optically cleaned at the retraction position by means of the cleaning light beam; and the light shielding device blocks the cleaning light beam which has passed through the optical element which has been shifted to the retraction position.

3. The exposure apparatus according to claim 2, further comprising an optical system disposed in a light path of the cleaning light beam, so as to irradiate the optical element which has been shifted to the retraction position with the cleaning light beam.

4. The exposure apparatus according to claim 3, wherein the cleaning light beam is the exposure light beam.

5. The exposure apparatus according to claim 3, wherein the cleaning light beam is a light beam from a cleaning light beam source disposed separately from the light beam source which emits the exposure light beam.

6. The exposure apparatus according to claim 2, wherein the light shielding device includes a preventive member for preventing the cleaning light beam which has passed through the optical element shifted to the retraction position from becoming a stray light.

7. The exposure apparatus according to claim 4, wherein the optical system includes a branch optical system which leads the exposure light beam to the optical element which has been shifted to the retraction position, while the image of the pattern is projected onto the substrate.

8. The exposure apparatus according to claim 4, wherein the optical system includes a branch optical system which leads the exposure light beam to the optical element which has been shifted to the retraction position, while the image of the pattern is not projected onto the substrate.

9. The exposure apparatus according to claim 8, wherein the branch optical system is retracted from the light path of the exposure light beam while the image of the pattern is projected onto the substrate.

10. The exposure apparatus according to claim 1, wherein the part of the optical elements are disposed on the light path of the exposure light beam and the cleaning light beam is the exposure light beam.

11. The exposure apparatus according to claim 10, wherein the light shielding device includes:

a light shielding plate disposed so as to be entered into and retracted from the light path of the exposure light beam; and a control unit connected to the light shielding plate and adapted to enter the light shielding plate into the light path of the exposure light beam during non-exposure to the substrate, the part of the optical elements being disposed between the light beam source and the light shielding plate.

12. The exposure apparatus according to claim 11, wherein:

an aperture stop is disposed between the light beam source and the light shielding plate; and a size of the aperture stop is set by the control unit to be larger during non-exposure to the substrate than during exposure to the substrate.

13. The exposure apparatus according to claim 11, wherein:

an illumination optical system which illuminates the mask with the exposure light beam is disposed between the light beam source and the mask; and the aperture stop is provided in the illumination optical system.

14. The exposure apparatus according to claim 11, wherein:

a projection optical system which projects the image of the pattern onto the substrate is disposed between the mask and the substrate; and the light shielding plate is disposed so as to be entered into and retracted from an area between the projection optical system and the substrate.

15. The exposure apparatus according to claim 14, wherein;

the projection optical system includes a variable aperture stop; and an aperture of the variable aperture stop is set to be larger during non-exposure to the substrate than during exposure to the substrate by the control unit.

16. The exposure apparatus according to claim 15, wherein:

an illumination optical system which illuminates the mask with the exposure light beam is disposed between the light beam source and the mask; and an aperture of a stop in the illumination optical system is set to be larger during non-exposure to the substrate than during exposure to the substrate by the control unit.

17. The exposure apparatus according to claim 10, wherein:

a projection optical system which projects the image of the pattern onto the substrate is disposed between the mask and the substrate; and the light shielding device is disposed in the projection optical system.

18. The exposure apparatus according to claim 17, wherein the light shielding device includes a variable aperture stop provided in the projection optical system and a control unit, which is connected to the variable aperture stop and fully closes the variable aperture stop during non-exposure to the substrate.

19. The exposure apparatus according to claim 18, wherein:
an illumination optical system which illuminates the mask with the exposure light beam is disposed between the light beam source and the mask; and
an aperture of a stop in the illumination optical system is set to be larger during non-exposure to the substrate than during exposure to the substrate by the control unit.

20. An exposure method for projecting an image of a pattern formed on a mask onto a substrate by irradiating the mask with an exposure light beam, said method comprising:
entering a light shielding plate into a light path of the exposure light beam during non-exposure to the substrate;
setting an aperture of an aperture stop disposed between a light beam source which emits the exposure light beam and the light shielding plate to be larger than during exposure to the substrate; and
entering the exposure light beam into a plurality of optical elements disposed between the light beam source which emits the exposure light beam and the light shielding plate.

21. The exposure method according to claim 20, wherein:
an illumination optical system which illuminates the mask with the exposure light beam is disposed between the light beam source and the mask; and
the aperture stop is provided in the illumination optical system.

22. The exposure method according to claim 20, wherein:
a projection optical system which projects the image of the pattern onto the substrate is disposed between the mask and the substrate; and
the light shielding plate is entered into an area between the projection optical system and the substrate.

23. The exposure method according to claim 22, wherein:
the projection optical system includes a variable aperture stop; and an aperture of the variable aperture stop is set to be larger during non-exposure to the substrate than during exposure to the substrate.

24. The exposure method according to claim 23, wherein:
an illumination optical system which illuminates the mask with the exposure light beam is disposed between the light beam source and the mask; and
an aperture of a stop in the illumination optical system is set to be larger during non-exposure to the substrate than during exposure to the substrate.

25. The exposure method according to claim 20, wherein:
a projection optical system which projects the image of the pattern onto the substrate is disposed between the mask and the substrate;
an illumination optical system which illuminates the mask with the exposure light beam is disposed between the light beam source and the mask;
the light shielding plate is a variable aperture stop disposed in the projection optical system in a fully closed state; and
the aperture stop is provided in an illumination optical system which illuminates the mask with the exposure light beam and which is disposed between the light beam source and the mask.

* * * * *